United States Patent
Tanaka et al.

(10) Patent No.: US 9,312,003 B2
(45) Date of Patent: Apr. 12, 2016

(54) SEMICONDUCTOR MEMORY DEVICE AND METHOD OF PERFORMING SETTING OPERATION IN SEMICONDUCTOR MEMORY DEVICE

(71) Applicant: KABUSHIKI KAISHA TOSHIBA, Minato-ku (JP)

(72) Inventors: Chika Tanaka, Yokohama (JP); Reika Ichihara, Yokohama (JP); Yoshihisa Iwata, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/487,607

(22) Filed: Sep. 16, 2014

(65) Prior Publication Data

US 2015/0078064 A1    Mar. 19, 2015

(30) Foreign Application Priority Data

Sep. 18, 2013  (JP) .................................. 2013-193307

(51) Int. Cl.
G11C 13/00    (2006.01)
G11C 7/04    (2006.01)

(52) U.S. Cl.
CPC .............. *G11C 13/0069* (2013.01); *G11C 7/04* (2013.01); *G11C 13/0007* (2013.01); *G11C 13/0061* (2013.01); *G11C 13/0064* (2013.01)

(58) Field of Classification Search
CPC ........... G11C 13/0069; G11C 13/0007; G11C 13/0061; G11C 13/0064; G11C 7/04; G11C 11/5614; G11C 11/5678; G11C 11/5685; G11C 13/00–13/0019

USPC ............................................ 365/148, 46, 100
See application file for complete search history.

(56) References Cited

U.S. PATENT DOCUMENTS

| | | | |
|---|---|---|---|
| 7,085,154 B2 | 8/2006 | Cho et al. | |
| 7,679,953 B2 * | 3/2010 | Sutardja | ........................ 365/163 |
| 8,270,201 B2 | 9/2012 | Sasaki | |
| 8,391,048 B2 | 3/2013 | Ichihara et al. | |
| 8,446,754 B2 | 5/2013 | Kim | |
| 2006/0181932 A1 | 8/2006 | Cho et al. | |
| 2011/0235401 A1 * | 9/2011 | Kunitake et al. | .............. 365/148 |

(Continued)

FOREIGN PATENT DOCUMENTS

JP    2004-362761 A    12/2004

(Continued)

*Primary Examiner* — Tha-o H Bui
*Assistant Examiner* — Alfredo Bermudez Lozada
(74) *Attorney, Agent, or Firm* — Oblon, McClelland, Maier & Neustadt, L.L.P.

(57) ABSTRACT

A semiconductor memory device comprises: a plurality of first lines; a plurality of second lines extending to intersect the first lines; a plurality of memory cells disposed respectively at intersections of the first and second lines and including a variable resistance element; and a control circuit configured to control a voltage applied to the memory cell. The control circuit is configured able to, during a setting operation that changes the memory cell to a set state, execute the setting operation such that a setting voltage is applied to a selected memory cell connected to a selected first line and a selected second line. The control circuit is configured able to change a voltage application time of the setting voltage according to a state of change of the selected memory cell during the setting operation to execute an additional setting operation that applies the setting voltage to the selected memory cell.

10 Claims, 29 Drawing Sheets

(56) References Cited

U.S. PATENT DOCUMENTS

2012/0014164 A1* 1/2012 Kamoshida et al. .......... 365/148
2012/0140544 A1 6/2012 Kim
2013/0003450 A1* 1/2013 Bedeschi ...................... 365/163

FOREIGN PATENT DOCUMENTS

| JP | 2011-40112 A | 2/2011 |
| JP | 2011-134383 A | 7/2011 |
| JP | 2012-123892 A | 6/2012 |

* cited by examiner

SEMICONDUCTOR MEMORY DEVICE AND METHOD OF PERFORMING SETTING OPERATION IN SEMICONDUCTOR MEMORY DEVICE

CROSS REFERENCE TO RELATED APPLICATIONS

This application is based on and claims the benefit of priority from prior Japanese Patent Application NO. 2013-193307, filed on Sep. 18, 2013, the entire contents of which are incorporated herein by reference.

BACKGROUND

1. Field

Embodiments described in the present specification relate to a semiconductor memory device, and a method of performing a setting operation in the semiconductor memory device.

2. Description of the Related Art

In recent years, a resistance varying memory device employing a variable resistance element as a storage element has been receiving attention as a successor candidate of flash memory. Now, a resistance varying memory device is assumed to include not only narrowly-defined resistance varying memory (ReRAM: Resistive RAM) that adopts a transition metal oxide as a recording layer and nonvolatilely stores a resistance value state thereof, but also phase change memory (PCRAM: Phase Change RAM) that employs the likes of chalcogenide as a recording layer and uses resistance value information of a crystalline state (conductor) and amorphous state (insulator) thereof, and so on.

In a memory cell array of the resistance varying memory device, a memory cell including the variable resistance element is disposed at an intersection of a bit line and a word line. In such a memory cell array, selection of the memory cell can be performed using characteristics of the variable resistance element. In addition, by alternately stacking the bit line and the word line and arranging memory cell arrays to be stacked three-dimensionally, it is also possible to achieve a high-density memory cell array.

In the case of executing a voltage application operation on a selected memory cell to change its resistance state, if the selected memory cell has not changed to a desired resistance state by a certain operation time, then the voltage application operation is re-executed. In the case of repeating this re-execution of the voltage application operation while changing a voltage application time or voltage value until the selected memory cell changes to the desired resistance state, there is a risk that the operation time prolongs, an excessive stress is applied to the selected memory cell and the memory cell ends up deteriorating.

DETAILED DESCRIPTION

A semiconductor memory device according to an embodiment comprises: a plurality of first lines; a plurality of second lines extending to intersect the first lines; a plurality of memory cells disposed respectively at intersections of the first lines and the second lines and including a variable resistance element; and a control circuit that controls a voltage applied to the memory cells. The control circuit is configured able to, during a setting operation that changes the memory cell to a set state, execute the setting operation such that a setting voltage is applied to a selected memory cell connected to a selected first line and a selected second line. The control circuit is configured able to change a voltage application time of the setting voltage according to a state of change of the selected memory cell during the setting operation to execute an additional setting operation that applies the setting voltage to the selected memory cell.

Next, embodiments of the present invention will be described in detail with reference to the drawings. Note that in the descriptions of the drawings in the embodiments below, places having identical configurations are assigned with identical reference symbols and duplicated descriptions thereof will be omitted.

[Overall Configuration]

Figure 1:
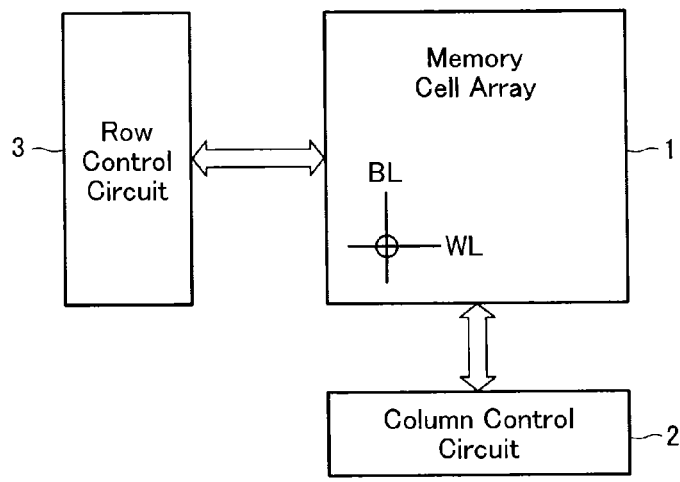
FIG. 1 is a block diagram of a semiconductor memory device according to a first embodiment.

FIG. 1 is a block diagram showing a configuration of a nonvolatile memory according to a first embodiment. This nonvolatile memory comprises a memory cell array 1 having memory cells disposed in a matrix therein, each of the memory cells using a variable resistance element VR which will be described later.

Electrically connected to a bit line BL of the memory cell array 1 is a column control circuit 2 that controls a voltage of the bit line BL in order to select the bit line BL of the memory cell array 1 and perform data erase of the memory cell, data write to the memory cell, and data read from the memory cell. Moreover, electrically connected to a word line WL of the memory cell array 1 is a row control circuit 3 that controls a voltage of the word line WL in order to select the word line WL of the memory cell array 1 and perform data erase of the memory cell, data write to the memory cell, and data read from the memory cell.

[Memory Cell Array 1]

Figure 2:
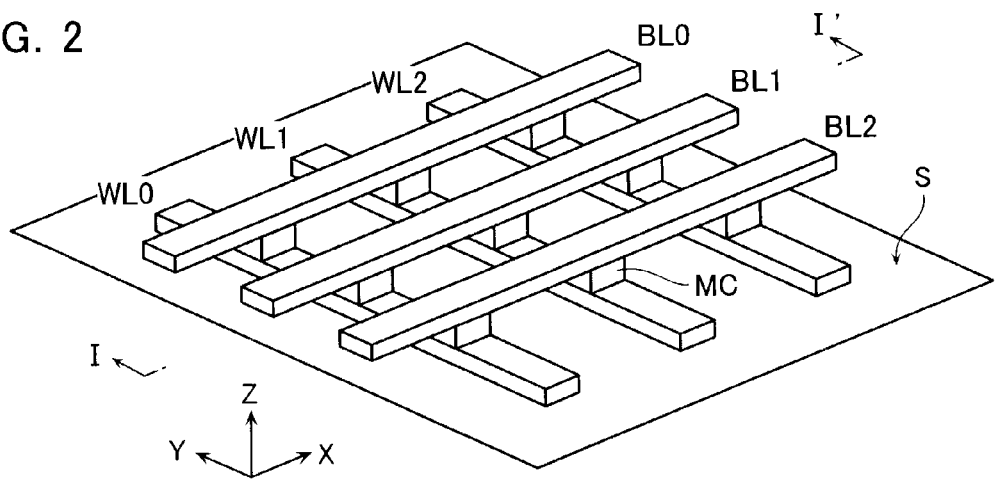
FIG. 2 is a perspective view of part of a memory cell array 1.
Figure 3:
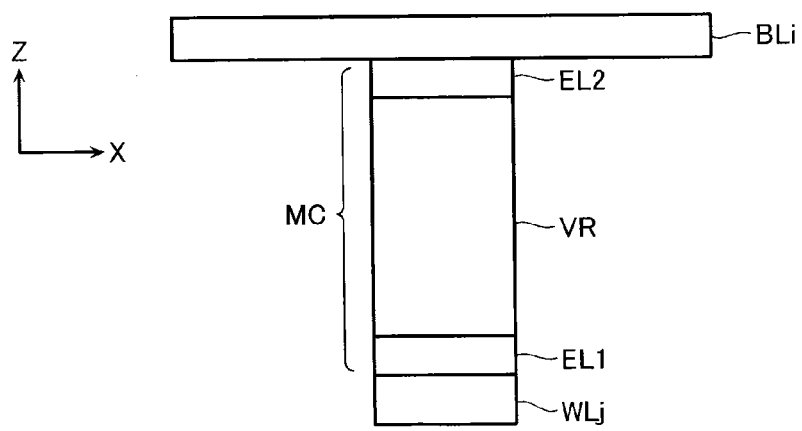
FIG. 3 is a cross-sectional view taken along the line I-I' and looking in the direction of the arrows in FIG. 2, showing a single memory cell portion.

FIG. 2 is a perspective view of part of the memory cell array 1, and FIG. 3 is a cross-sectional view taken along the line I-I' and looking in the direction of the arrows in FIG. 2, showing a single memory cell portion. Word lines WL0 to WL2 acting as a plurality of first lines are arranged in a Y direction parallel to a surface of a semiconductor substrate S. Bit lines BL0 to BL2 acting as a plurality of second lines are arranged in an X direction parallel to the surface of the semiconductor substrate S so as to intersect the word lines WL. A memory cell MC is disposed at each of intersections of the word lines WL0 to WL2 and the bit lines BL0 to BL2 to be sandwiched by both lines. The first and second lines are desirably of a material that is heat resistant and has a low resistance value. For example, the likes of W, WN, WSi, NiSi, and CoSi may be employed as the material.

[Memory Cell MC]

As shown in FIG. 3, the memory cell MC is a circuit having the variable resistance element VR connected between the bit line BL and the word line WL. Disposed below and above the variable resistance element VR in a Z direction are electrodes EL1 and EL2 that function as a barrier metal and an adhesive layer. The variable resistance element VR is disposed on the electrode EL1, and the electrode EL2 is disposed on the variable resistance element VR. A material that includes a metal element is employed as an electrode material of the electrode EL2, the metal element configuring a conductive filament. The following may be selected as the metal element employed in the electrode EL2, namely, for example, Ag, Ni, Co, Al, Zn, Ti, Ta, Cu, and so on. Ions of the metal element employed in this electrode EL2 migrate in the variable resistance element VR to form the conductive filament. The electrode EL2 may also further have the following stacked therein, namely, impurity-doped silicon, W, Ti, $TiN_x$, $TiSi_x$, $TiSi_xN_y$, Ta, $TaN_x$, and $TaSi_xN_y$. Various kinds of metal elements may be employed as the electrode EL1. The electrode EL1 may be selected from, for example, impurity-doped silicon, W, Ti, $TiN_x$, $TiSi_x$, $TiSi_xN_y$, Ta, $TaN_x$, and $TaSi_xN_y$, or stacked structures of these.

[Variable Resistance Element]

Employed as the variable resistance element VR is a substance whose resistance value can be changed via the likes of an electric field, a current, heat, and chemical energy, by a voltage application. The variable resistance element VR is configured from, for example, a film that includes silicon oxide ($SiO_x$) acting as a base material. Specifically, it is configured from a single layer film of silicon oxide ($SiO_x$) or a structure in which silicon oxide ($SiO_x$) and a semiconductor or insulator are stacked. Employable as the semiconductor or insulator stacked on the silicon oxide ($SiO_x$) are the likes of silicon (Si) or hafnium oxide ($HfO_x$). As will be described later, the variable resistance element VR of the present embodiment has current-voltage characteristics with respect to applied voltage that differ according to its state. This can be utilized to employ the variable resistance element VR as a selection element.

[Memory Cell Array and Peripheral Circuits Thereof]

Figure 4:
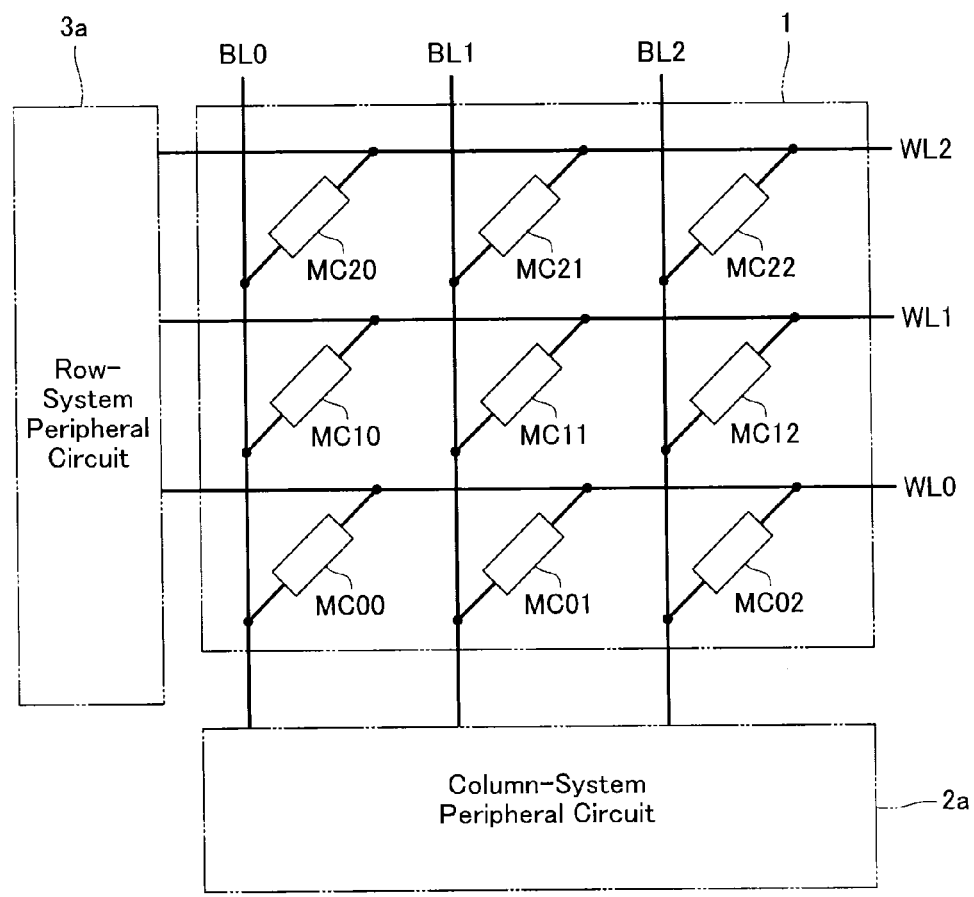
FIG. 4 is a circuit diagram of the memory cell array 1 and peripheral circuits thereof.

FIG. 4 is a circuit diagram of the memory cell array 1 and its peripheral circuits. One ends of each of the bit lines BL are connected to a column-system peripheral circuit 2a which is part of the column control circuit 2. In addition, one ends of each of the word lines WL are connected to a row-system peripheral circuit 3a which is part of the row control circuit 3. A voltage required in an operation on the bit line BL and the word line WL is supplied by these column-system peripheral circuit 2a and row-system peripheral circuit 3a. A different function required for operation control of the bit line BL and the word line WL may also be added to each of the column-system peripheral circuit 2a and the row-system peripheral circuit 3a.

Hereafter, when a voltage is applied to the memory cell MC such that the bit line BL is provided with a high voltage and the word line WL is provided with a low voltage, it may be said that a voltage of positive polarity is applied. When a voltage is applied to the memory cell MC such that the bit line BL is provided with a low voltage and the word line WL is provided with a high voltage, it may be said that a voltage of negative polarity is applied.

[Operation of Memory Cell]

Figure 5:
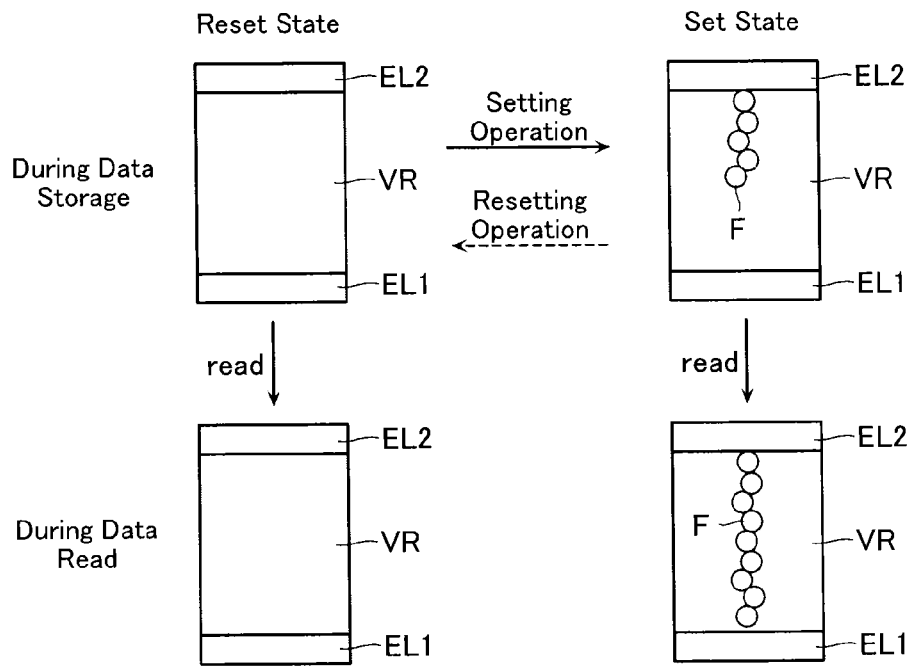
FIG. 5 is a view explaining an operation method of the memory cell.

FIG. 5 is a view explaining an operation method of the memory cell MC including the variable resistance element VR.

By applying a certain voltage for a certain time to the variable resistance element VR of the selected memory cell MC, the variable resistance element VR of the selected memory cell MC changes to a set state at which the memory cell MC becomes conductive at a voltage lower than a certain voltage. Hereafter, this operation that changes the variable resistance element VR to the set state is called a setting operation. The set state is a state where a conductive filament F connecting the electrodes EL1 and EL2 extends but only a portion thereof is disconnected.

On the other hand, by applying a certain voltage for a certain time to the variable resistance element VR of the selected memory cell MC, the variable resistance element VR of the selected memory cell MC changes to a reset state at which the memory cell MC becomes conductive at a voltage higher than a certain voltage. Hereafter, this operation that changes the variable resistance element VR to the reset state is called a resetting operation. The reset state is a state where a disconnection distance of the conductive filament F is longer than in the set state.

During a read operation, a certain read voltage is applied to the variable resistance element VR of the selected memory cell MC. As a result, the conductive filament F extends toward an electrode EL1 side. A voltage when the conductive filament F extends to reach the electrode EL1 differs between the set state and the reset state. That difference can be utilized to read a state of the selected memory cell MC.

Figure 6:
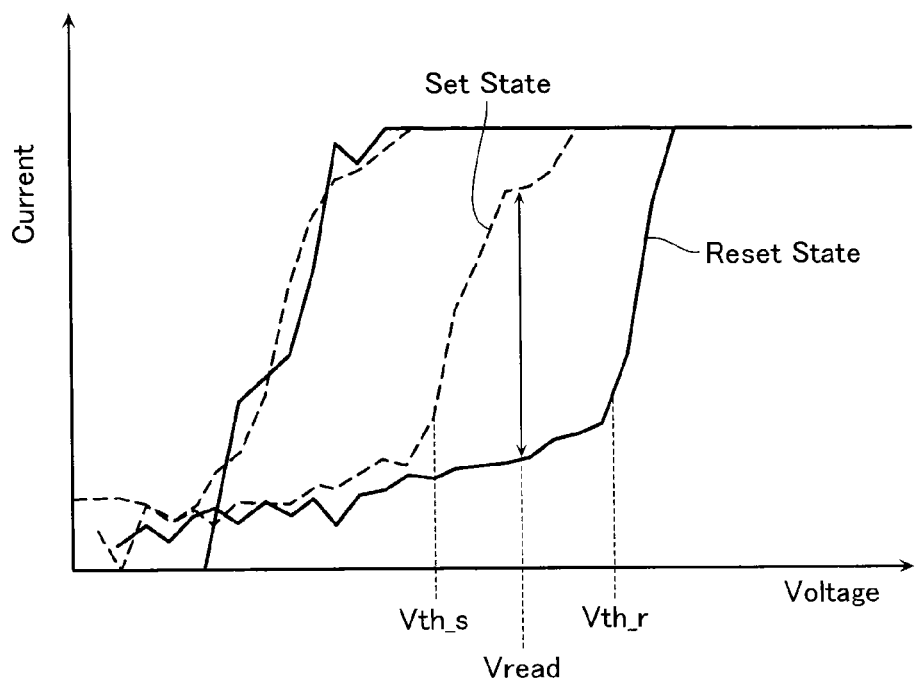
FIG. 6 is a view explaining a data storage state of the memory cell.

FIG. 6 is a view explaining a data storage state of the memory cell MC. FIG. 6 shows electrical characteristics of the set state and the reset state of the variable resistance element VR. FIG. 6 is an example of the case where silver (Ag) is employed as the electrode EL2, and silicon oxide ($SiO_x$) is employed as the base material of the variable resistance element VR. In FIG. 6, current-voltage characteristics of the set state are shown by broken lines, and current-voltage characteristics of the reset state are shown by solid lines.

In the case where the memory cell MC is in the set state, when a voltage of voltage $Vth\_s$ or more is applied, a large amount of current flows in the memory cell MC. On the other hand, in the case where the memory cell MC is in the reset state, when a voltage of voltage $Vth\_r$ or more is applied, a large amount of current flows in the memory cell MC. In this case, if it is assumed that the voltage $Vth\_s$ is smaller than the voltage $Vth\_r$ and that the read voltage is a voltage Vread satisfying $Vth\_s \leq Vread < Vth\_r$, then a large difference in current during application of the read voltage Vread occurs between the set state and the reset state. A resistance state of the memory cell MC is read as data, based on this current difference.

Now, it may be configured such that a voltage smaller than the voltage $Vth\_s$ is applied to an unselected memory cell MC during the read operation, by control of an applied voltage during the read operation. As a result, only an extremely small current flows in the unselected memory cell MC, and the memory cell MC may have a function as a selection element.

[Operation of Semiconductor Memory Device]

Next, a detailed description of operation on the memory cell MC is given. As previously described, the variable resistance element VR achieves a low-resistance state (set state) by the setting operation that applies a certain fixed voltage or more to both ends thereof, and achieves a high-resistance state (reset state) by the resetting operation that applies a certain fixed voltage or more to both ends thereof. In the description of the embodiments below, description will be given for the setting operation, but a similar operation may be applied also during the resetting operation.

The setting operation according to the present embodiment will be described below with reference to FIGS. 7 and 8. Now, the setting operation in the present embodiment is an operation that applies a setting voltage of positive polarity to the selected memory cell MC to change the variable resistance element VR to the set state. The setting operation will be described below.

Figure 7:
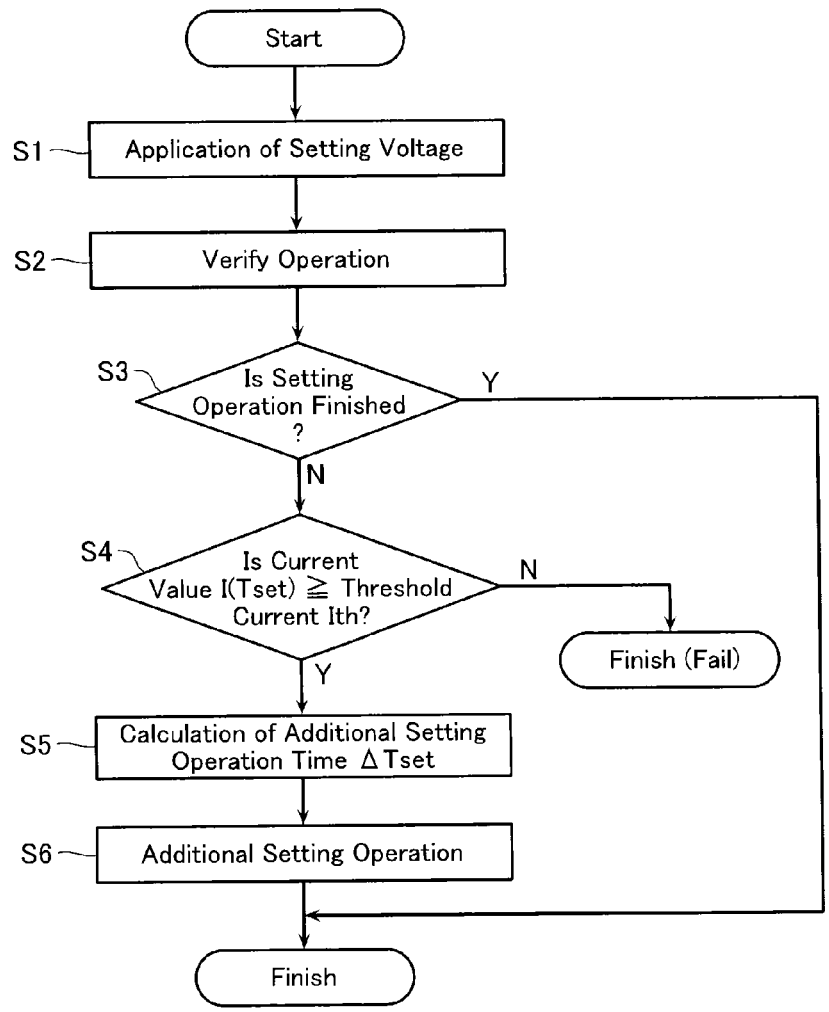
FIG. 7 is a flowchart explaining steps during a setting operation of the first embodiment.

FIG. 7 is a flowchart explaining steps during the setting operation of the present embodiment. FIG. 8 is a view showing a relationship between voltage application time and cell current during the setting operation of the present embodiment.

When the setting operation is started, first, the setting voltage is applied to the selected memory cell MC (step S1). This setting voltage application operation continues only during a predetermined setting operation time Tset.

Next, a verify operation that determines whether the resistance value of the selected memory cell MC has changed to a desired value due to the setting voltage application or not, is executed (step S2). This verify operation is an operation that applies a certain read voltage to the selected memory cell MC after the selected memory cell MC has been applied with the setting voltage for the setting operation time Tset, and detects a cell current Icell (=I(Tset)) flowing in the selected memory cell MC, thereby determining the state of the selected memory cell MC.

Figure 8:
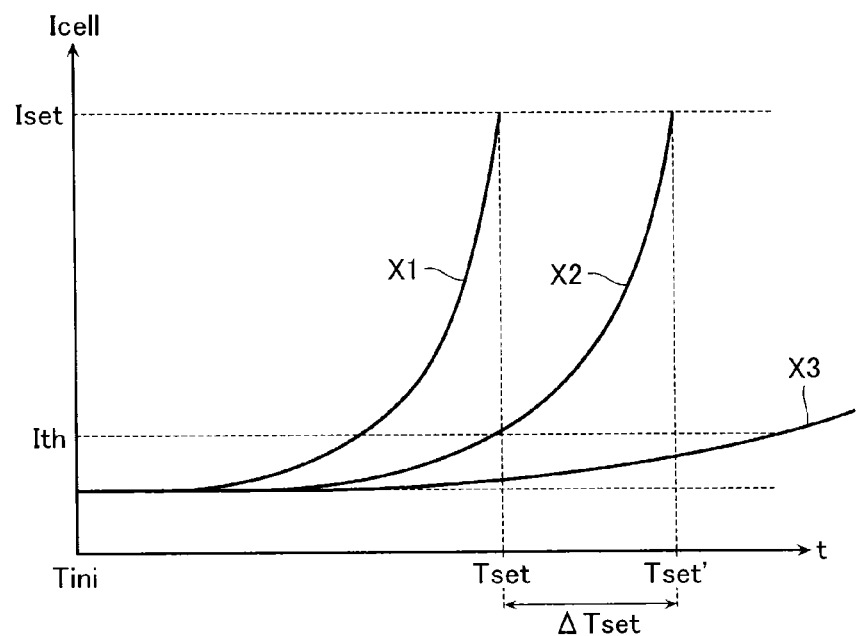
FIG. 8 is a view showing a relationship between voltage application time and cell current during the setting operation of the first embodiment.

As shown in FIG. 8, in the case that the cell current I(Tset) after the setting voltage has been applied only during the setting operation time Tset has reached a current value Iset (the case of line X1 of FIG. 8), the selected memory cell MC is determined to be in the low-resistance set state and the operation finishes assuming the setting operation to have been normally completed (Y of step S3). On the other hand, in the case that the cell current I(Tset) after the setting voltage has been applied only during the setting operation time Tset has not reached the current value Iset (the cases of lines X2 and X3 of FIG. 8), the setting operation is assumed to have not been completed, and the operation shifts to the following step S4 (N of step S3).

Next, it is determined whether the cell current I(Tset) after the setting voltage has been applied only during the setting operation time Tset has reached a certain threshold current Ith or not (step S4). The threshold current Ith is a threshold current for determining that a certain selected memory cell MC does not change to the set state even when applied with the setting voltage only during the certain setting voltage time Tset, but changes to the setting state if an additional setting operation time LTset is added.

In the case that the cell current I(Tset) after the setting voltage has been applied only during the setting operation time Tset is less than the threshold current Ith (the case of line X3 of FIG. 8), the cell current I(Tset') never reaches the current value Iset even if the setting voltage is applied during an extended operation time Tset' (setting operation time Tset+ additional setting operation time ΔTset). Hence, the setting operation is determined to have failed. In this case, determination of step S4 is N, and the operation finishes, and the additional setting operation will not be conducted, assuming that the setting operation on this selected memory cell MC has failed.

On the other hand, in the case that the cell current I(Tset) after the setting voltage has been applied only during the setting operation time Tset is not less than the threshold current Ith (the case of line X2 of FIG. 8), it is determined that, if the setting voltage is applied extending the operation time to the time Tset' (setting operation time Tset+additional setting operation time ΔTset), the cell current I(Tset') reaches the current value Iset, and the selected memory cell MC changes to the low-resistance set state. In this case, determination of step 4 is Y, and the operation shifts to step S5.

Next, in step S5, the additional setting operation time ΔTset is calculated. This additional setting operation time ΔTset is determined in view of element variation of the variable resistance element VR. In the case that an ion memory in which a conductive path is formed by filament extension due to inter-site migration of silver ions is employed as the variable resistance element VR, variation in inter-site distance may be determined by current during the setting operation.

Figure 9:
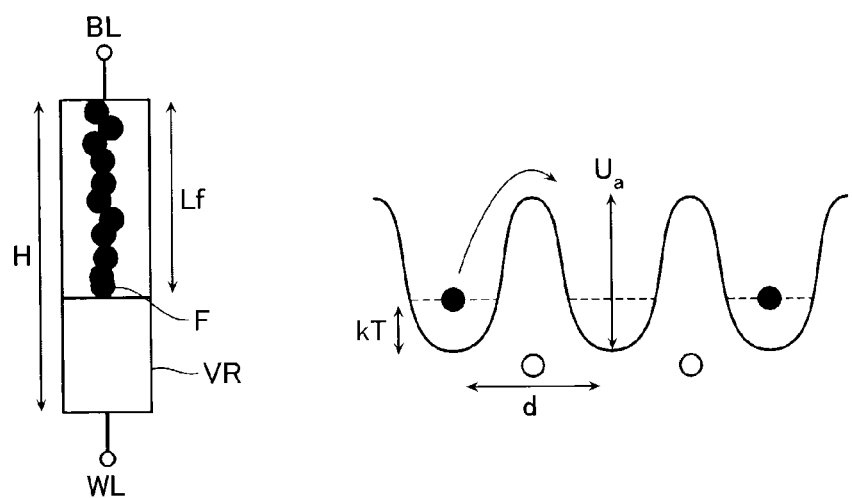
FIG. 9 is a schematic view showing a state of the memory cell during the setting operation of the first embodiment.

FIG. 9 is a schematic view showing a state of the memory cell during the setting operation of the present embodiment. The conductive filament F is extending from a selected bit line BL side to a selected word line WL side. In addition, an energy gap Ua when silver ions (illustrated by black circles) existing between a substance configuring the variable resistance element VR (for example, silicon oxide ($SiO_2$), illustrated by white circles in FIG. 9) migrate inter-site is indicated.

Now, in the case of assuming a film thickness H of the variable resistance element VR, a conductive filament length Lf, an inter-site distance d of the substance configuring the variable resistance element VR (for example, silicon oxide ($SiO_2$)), the energy gap Ua when the silver ions migrate inter-site, a voltage V applied during setting, a temperature T, a Boltzmann constant k, an elementary charge q, and a hopping frequency v of silver ions, a growth rate $v_f$ of the conductive filament F may be expressed by the following mathematical expression 1.

$$v_f = \frac{dL_f}{dt} = \beta \exp\left(\frac{-qU_a}{kT}\right) \sinh\left(\frac{V \cdot \kappa}{T}\right)$$ [Mathemaical Expression 1]
$$\beta = 2 \cdot d \cdot v$$
$$\kappa = \frac{qd}{2k(H - L_f)}$$

The growth rate $v_f$ of the conductive filament F may be calculated from the cell current I(Tset) after the setting voltage has been applied only during the setting operation time Tset. Variation of inter-site distance d can be obtained based on this growth rate $v_f$ of the conductive filament F. The inter-site distance d is different for each selected memory cell MC. The additional setting operation time ΔTset of each selected memory cell MC is calculated based on the variation of inter-site distance d of each of the selected memory cells MC calculated in this way.

Next, in step S6, an additional setting operation that applies the setting voltage extending the operation time to the time Tset' (setting operation time Tset+additional setting operation time ΔTset), is executed. After this additional setting operation has been completed, the operation on the selected memory cell MC is finished.

[Advantages]

Due to the setting operation according to the present embodiment, an additional setting operation is executed on the selected memory cell MC to which the setting voltage was applied setting the setting operation time to the time Tset, but which did not change to the set state. At this time, the additional setting operation time ΔTset is calculated for each selected memory cell MC based on variation of inter-site distance d of the selected memory cell MC. Therefore, during the additional setting operation of the selected memory cell MC, only a voltage application time required for the selected memory cell MC to change to the set state is set. This additional setting operation need not be repeated a plurality of times, and need only be performed one time on the selected memory cell MC. As a result, the number of times of trials of the additional setting operation decreases, hence an excessive stress can be prevented from being applied to the selected memory cell MC and deterioration of the memory cell MC can be prevented. In addition, because the number of times of trials of the additional setting operation decreases, it becomes possible for speed of the setting operation to be improved, and energy consumption required in the operation can also be suppressed.

Second Embodiment

Next, a second embodiment will be described with reference to FIGS. 10 to 31. An overall configuration of the semiconductor memory device of the second embodiment is similar to that of the first embodiment, and a detailed description thereof will be omitted. In addition, places having a similar configuration to in the first embodiment are assigned with identical reference symbols, and a duplicated description thereof will be omitted. The setting operation and the additional setting operation of the present embodiment differ from those of the first embodiment in being executed continuously without the verify operation being sandwiched therebetween. Operation of the semiconductor memory device according to the present embodiment will be described below with reference to FIGS. 10 to 31.

[Operation of Semiconductor Memory Device]

Figure 10:
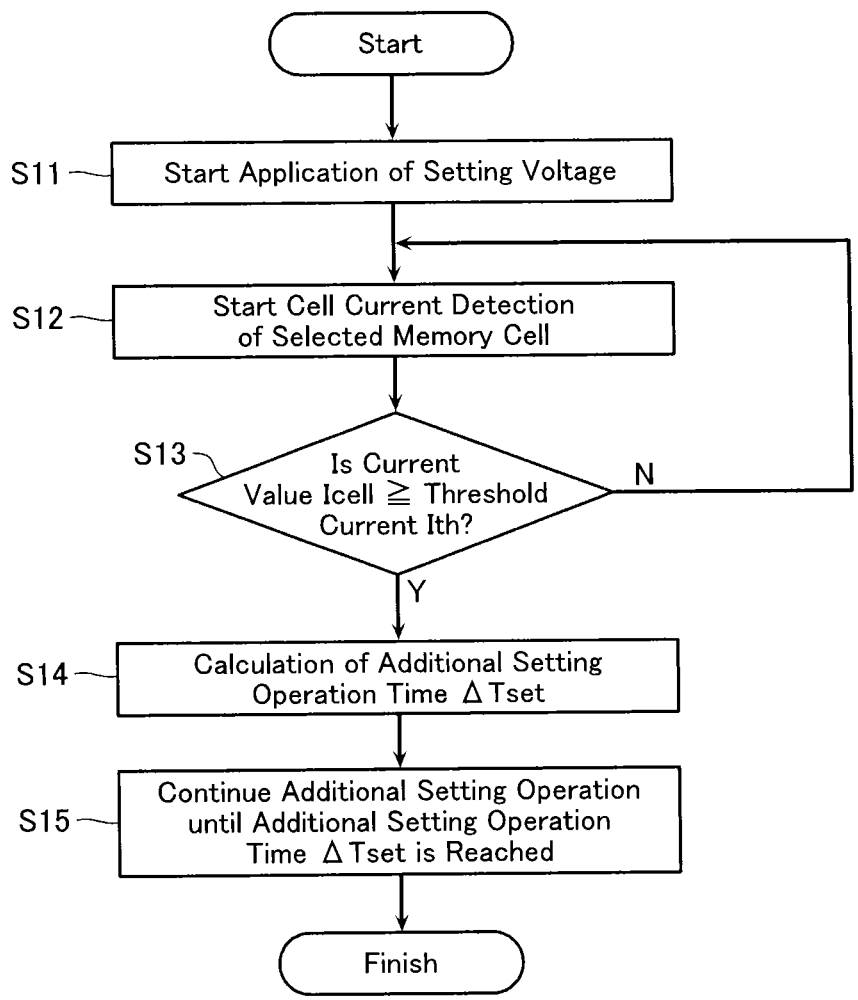
FIG. 10 is a flowchart explaining steps during a setting operation of a second embodiment.

First, a setting operation according to the present embodiment will be described with reference to FIG. 10. Now, the setting operation in the present embodiment will be described as an operation executed on one selected memory cell MC and a is configured to perform such an operation. FIG. 10 is a flowchart explaining steps during the setting operation of the present embodiment.

When the setting operation is started, first, the setting voltage is applied to the selected memory cell MC (step S11).

Next, detection of the cell current flowing in the selected memory cell MC is started (step S12). In addition, at this time, time since starting detection of the cell current is also measured.

Next, it is determined whether the cell current has reached a certain threshold current Ith or not, by a cell current detection operation (step S13). If the cell current has reached the certain threshold current Ith, the selected memory cell MC is judged to have changed to a certain resistance state, and operation shifts to the additional setting operation for changing to the complete set state (Y of step S13). At this time, application of the setting voltage on the selected memory cell MC continues. On the other hand, if the cell current has not reached the certain threshold current Ith, the selected memory cell MC is determined not to have changed to the certain resistance state, and the setting voltage application and cell current detection operation are continued (N of step S13).

Next, the additional setting operation time ΔTset is calculated based on the time until the cell current reaches the certain threshold current Ith (step S14). This additional setting operation time ΔTset is determined in view of element variation of the variable resistance element VR.

Next, in step S16, the additional setting operation that applies the setting voltage to the selected memory cell MC until the operation time passes the time Tset' (setting operation time Tset+additional setting operation time ΔTset), is executed. After this additional setting operation has been completed, the operation on the selected memory cell MC is finished.

[Advantages]

In the setting operation according to the present embodiment also, the additional setting operation time ΔTset is calculated for each selected memory cell MC. Therefore, during the additional setting operation of the selected memory cell MC, only a voltage application time required for the selected memory cell MC to change to the set state is set. This additional setting operation is never executed for an unnecessarily long time period, hence an excessive stress can be prevented from being applied to the selected memory cell MC and deterioration of the memory cell MC can be prevented. In addition, because the operation time of the additional setting operation decreases, it becomes possible for speed of the setting operation to be improved, and energy consumption required in the operation can also be suppressed.

[Control Circuit]

Figure 11:
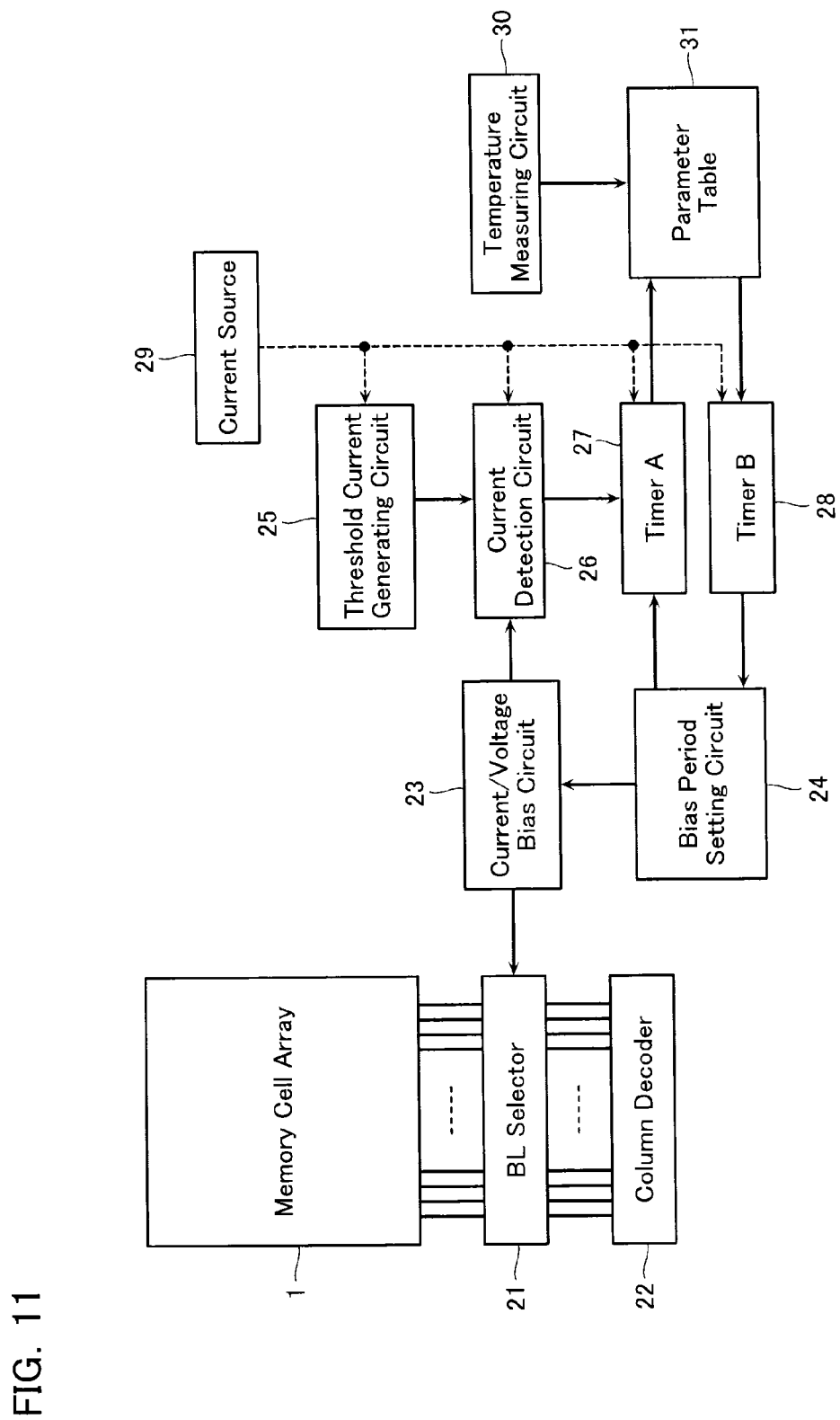
FIG. 11 is a block diagram of a semiconductor memory device according to the second embodiment.

Next, the control circuit for executing the operation of the present embodiment will be described in detail. FIG. 11 is a block diagram of the semiconductor memory device according to the present embodiment. FIG. 11 shows a detailed configuration of the column control circuit 2. The column control circuit 2 includes a bit line selector 21 and a column decoder 22. The bit line selector 21 and the column decoder 22 configure the column-system peripheral circuit 2a. The bit line selector 21 selects a selected bit line based on a signal sent from the column decoder 22, and applies to the selected bit line a voltage transferred from a current/voltage bias circuit 23.

The column control circuit 2 includes the current/voltage bias circuit 23, a bias period setting circuit 24, a threshold current generating circuit 25, a current detection circuit 26, a timer A (27), a timer B (28), a current source 29, a temperature measuring circuit 30, and a parameter table 31. Briefly explaining operation of the control circuit, the current/voltage bias circuit 23 transfers to the bit line selector 21 a current/voltage required in the operation. The current detection circuit 26 compares a current flowing in the selected memory cell MC with the threshold current Ith generated in the threshold current generating circuit 25. The time until the current flowing in the selected memory cell MC reaches the threshold current Ith is measured by the timer A (27), and transmitted to the parameter table 31. The parameter table 31 selects the additional setting operation time ΔTset based on the time until the current flowing in the selected memory cell MC reaches the threshold current Ith, and transmits the additional setting operation time ΔTset to the timer B (28). The additional setting operation is executed based on the operation time of this timer B (28).

Figure 12:
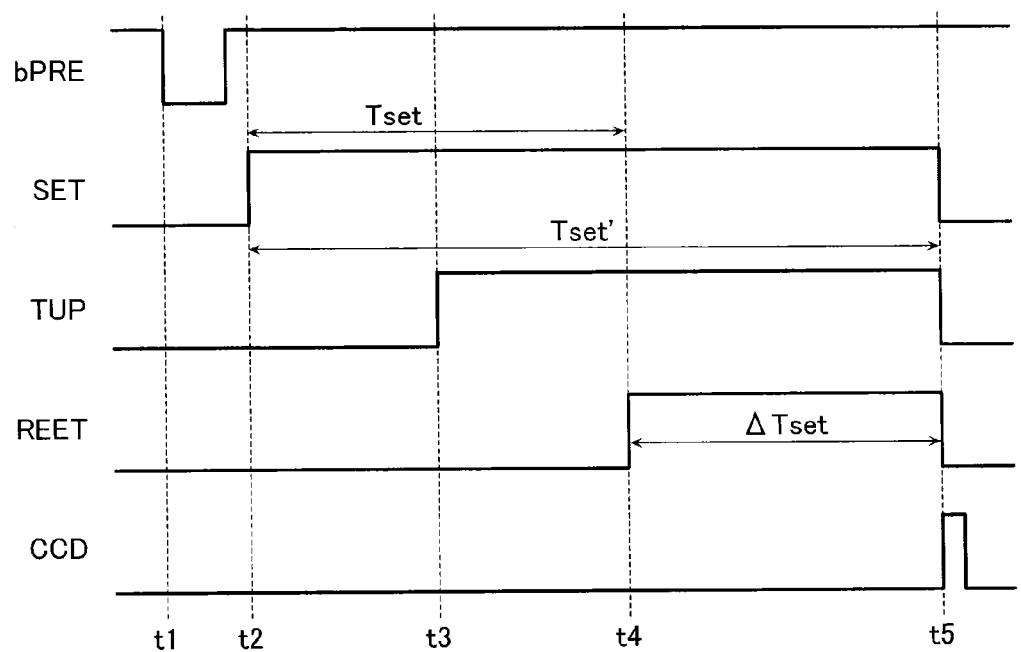
FIG. 12 is an operation waveform chart of the semiconductor memory device according to the second embodiment.

Next, a detailed configuration of each part of the control circuit will be described with reference to FIGS. 13 to 31, and then detailed operation using the control circuit will be described with reference to FIG. 12.

Figure 13:
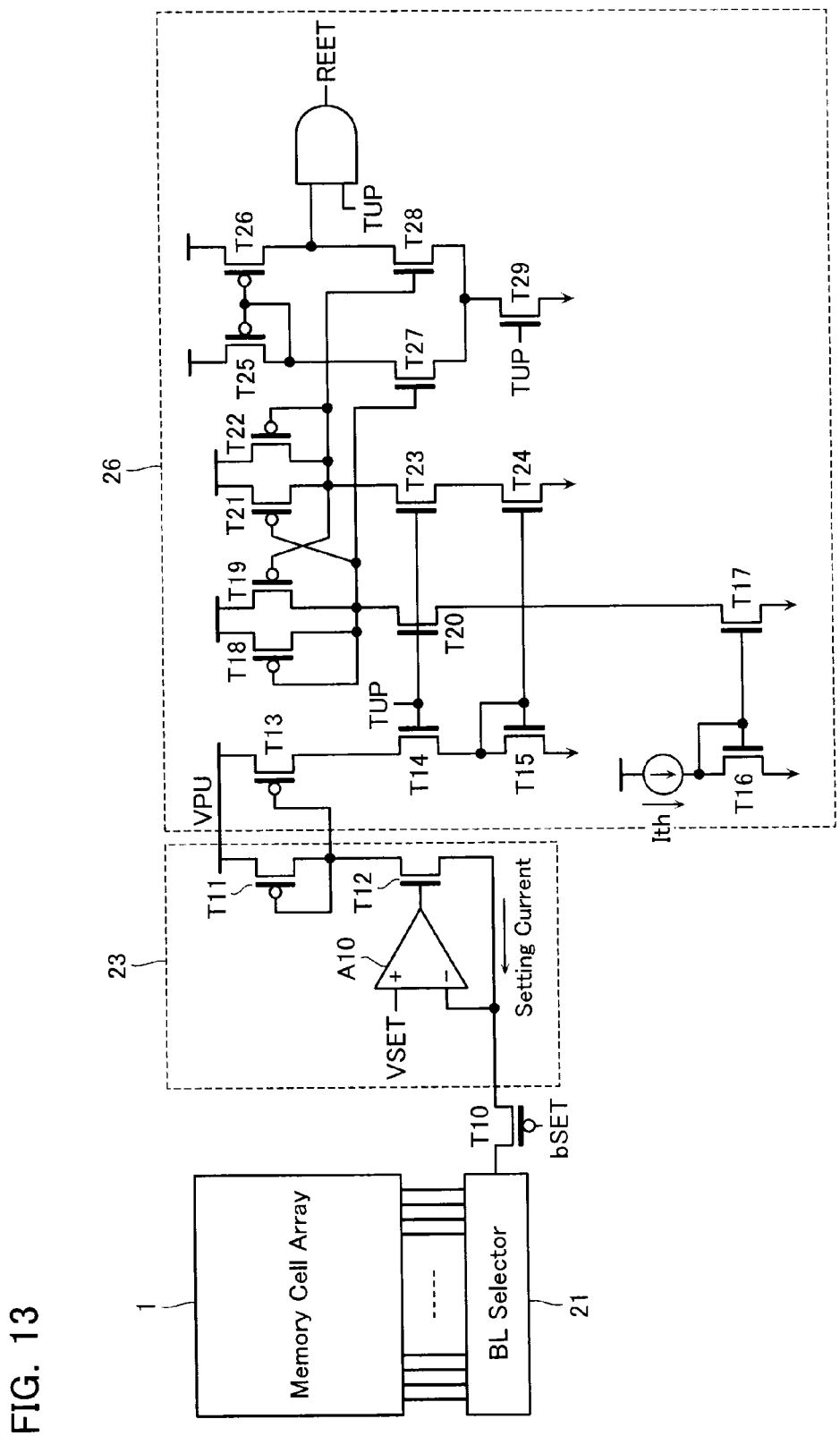
FIG. 13 is a circuit diagram of a control circuit of the semiconductor memory device according to the second embodiment.

FIG. 13 is a circuit diagram showing the configuration of the current/voltage bias circuit 23 and the current detection circuit 26. The current/voltage bias circuit 23 comprises transistors T11 and T12 and a differential amplifier A10, and is a circuit that transfers a setting voltage VSET or a setting current required in the setting operation, to the bit line selector 21, via the transistor T10. The current detection circuit 26 comprises transistors T13 to T29 and a logic circuit C10. When inputted with a signal TUP, the current detection circuit 26 starts the operation, and detects the current flowing in the selected memory cell MC via the selected bit line BL. When the current flowing in the selected memory cell MC exceeds the threshold current Ith, the current detection circuit 26 sets a signal REET to "H".

Figure 14:
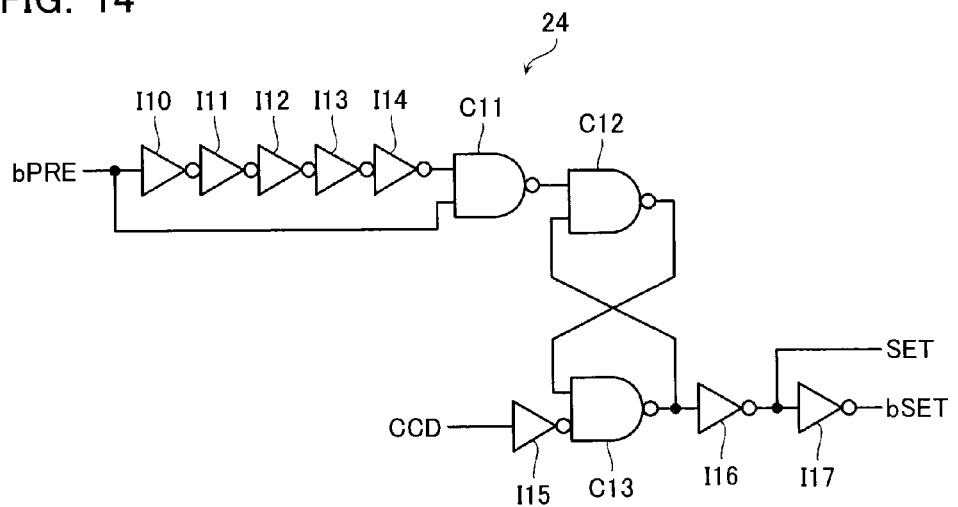
FIG. 14 is a circuit diagram of the control circuit of the semiconductor memory device according to the second embodiment.

FIG. 14 is a circuit diagram showing the configuration of the bias period setting circuit 24. The bias period setting circuit 24 comprises inverters I10 to I17 and logic circuits C11 to C13. The bias period setting circuit 24 is inputted with a signal bPRE and a signal CCD indicating start of the setting operation. A signal SET for starting the setting operation is set to an "H" state based on the signal bPRE. Moreover, when the signal CCD has become the "H" state, the signals SET and bSET are inverted to finish the setting operation.

Figure 15:
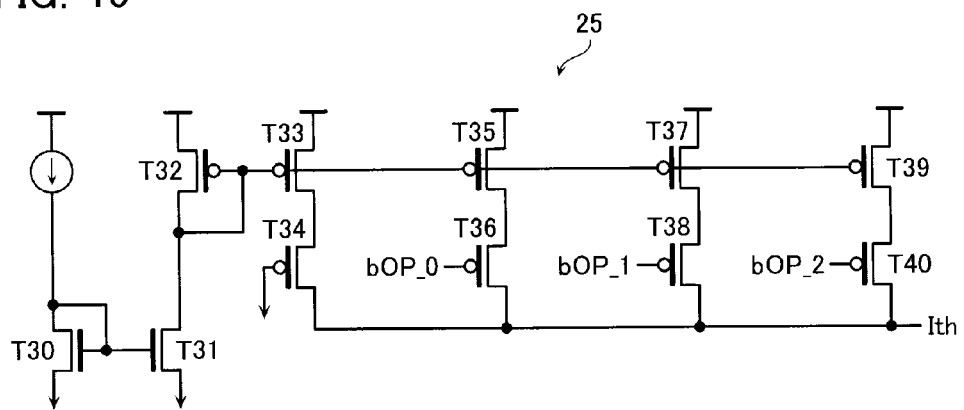
FIG. 15 is a circuit diagram of the control circuit of the semiconductor memory device according to the second embodiment.

FIG. 15 is a circuit diagram showing the configuration of the threshold current generating circuit 25. The threshold current generating circuit 25 is configured from transistors T30 to T40. A direct current power source connected to the transistor T30 is an input from external, and employs the likes of current sources Isrc and IsrcT that will be described later. The threshold current Ith outputted from the threshold current generating circuit 25 may have its current amount adjusted by switching signals bOP_0 to bOP_2.

Figure 16:
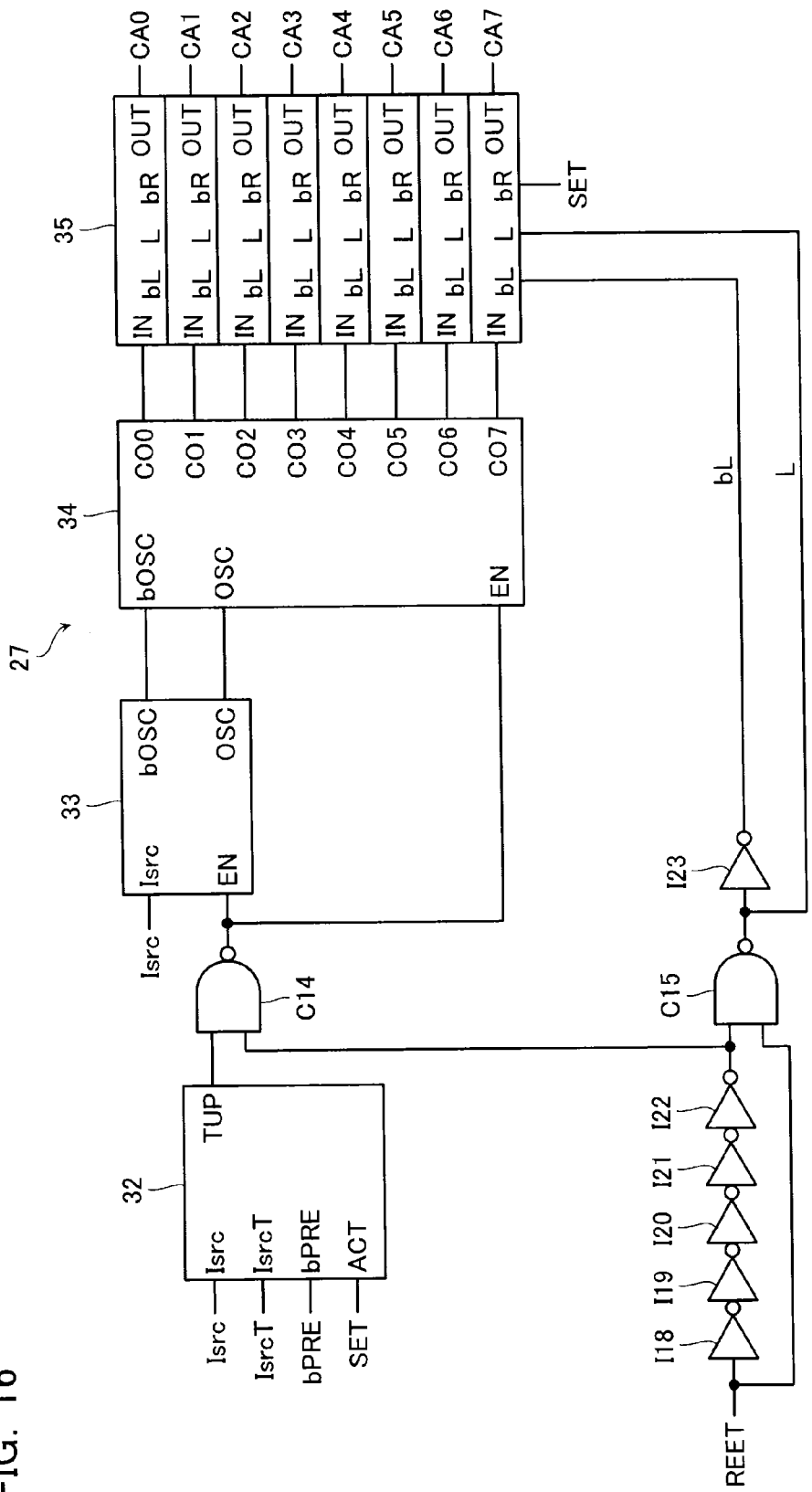
FIG. 16 is a circuit diagram of the control circuit of the semiconductor memory device according to the second embodiment.

FIG. 16 is a circuit diagram showing the configuration of the timer A (27). The timer A (27) comprises an analog timer 32, a current-controlled oscillator 33, a binary counter 34, a latch 35, inverters I18 to I23, and logic circuits C14 to C15. Connected to the timer A (27) are the current source Isrc which is non-temperature-dependent and the current source IsrcT whose current increases with temperature rise. The current source IsrcT whose current increases with temperature rise is provided because there is a chance of the setting operation time reducing with temperature rise.

The timer A (27) starts the operation based on the signal bPRE indicating start of the setting operation, to operate the analog timer 32. This analog timer 32 is provided for guaranteeing a minimum period required for the setting operation. When it is detected by the analog timer 32 that a certain time has elapsed, the signal TUP becomes an "H" state, and the current control oscillator 33, the binary counter 34, and the latch 35 begin their operation. These current control oscillator 33, binary counter 34, and latch 35 measure a time until the cell current flowing in the selected memory cell MC reaches the threshold current Ith and the signal REET outputted by the current detection circuit 26 becomes "H". This timer A (27) makes it possible to measure the time from the setting operation starting until the cell current flowing in the selected memory cell MC becomes the threshold current Ith. This measurement result is transmitted to the parameter table 31 as signals CA0 to CA7.

Figure 17:
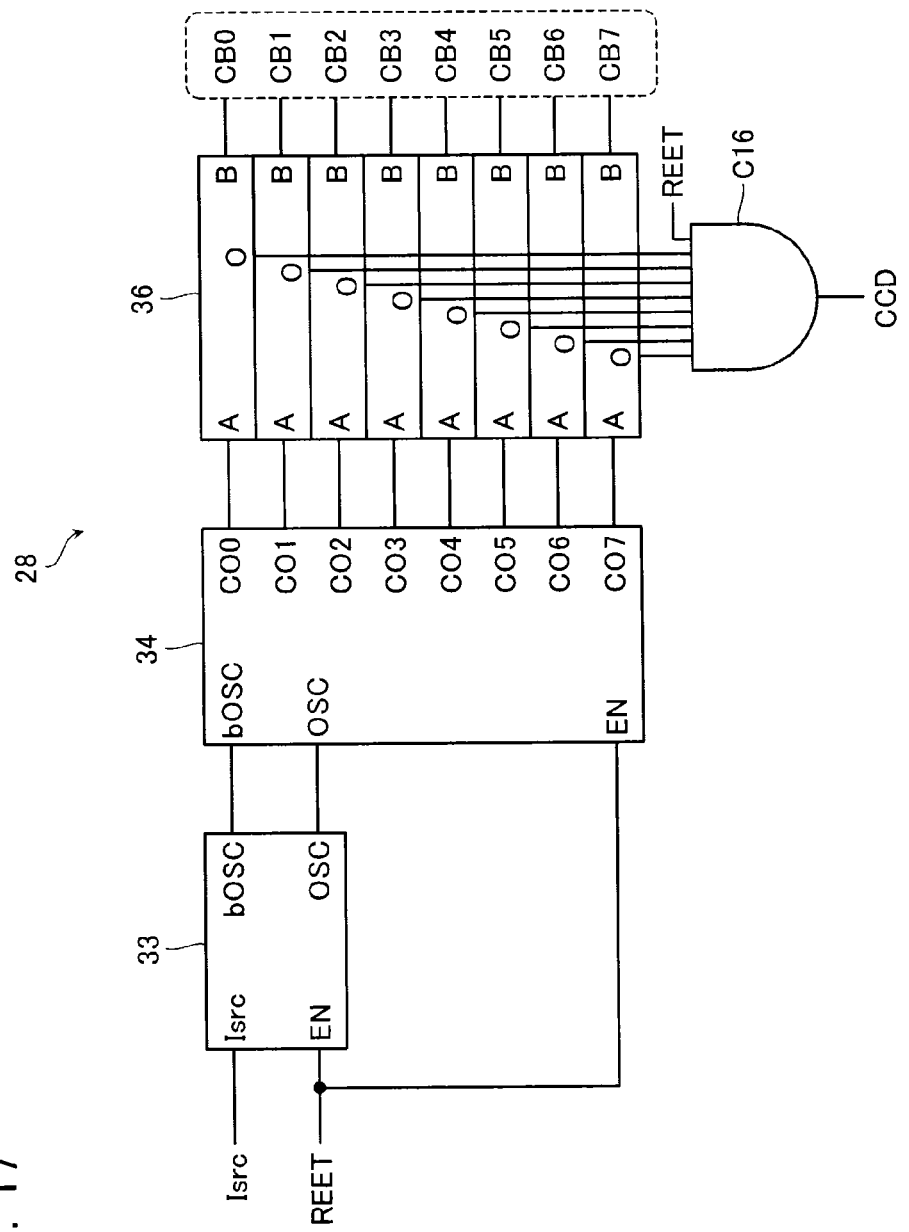
FIG. 17 is a circuit diagram of the control circuit of the semiconductor memory device according to the second embodiment.

FIG. 17 is a circuit diagram showing the configuration of the timer B (28). The timer B (28) comprises the current control oscillator 33, the binary counter 34, a converter 36, and a logic circuit C16. Connected to the timer B (28) is the current source Isrc which is non-temperature-dependent. This current source Isrc may be a current source whose current increases with temperature rise. Moreover, the timer B (28) is inputted with the signal REET and the output signals CB0 to CB7 from the parameter table 31. When the cell current flowing in the selected memory cell MC reaches the threshold current Ith and the signal REET outputted by the current detection circuit 26 becomes "H", the timer B (28) begins its operation and the binary counter 34 counts up until a count value of the binary counter 34 matches the output signals CB0 to CB7 from the parameter table 31. As a result, after the signal REET has become "H", the additional setting operation is continued until a time designated by the parameter table 31. When the time designated by the parameter table 31 is reached, the output signal CCD of the comparator 36 becomes "H", and the operation finishes.

Figure 18:
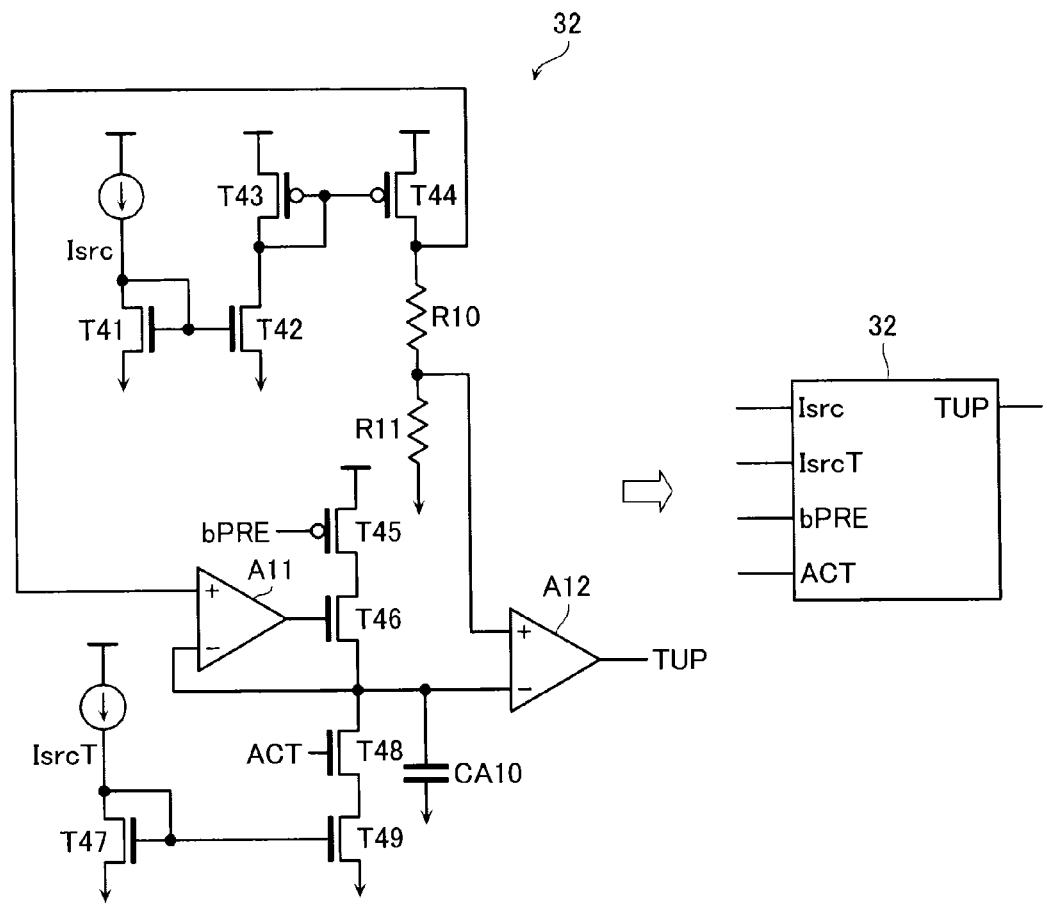
FIG. 18 is a circuit diagram of the control circuit of the semiconductor memory device according to the second embodiment.

FIG. 18 is a circuit diagram showing the configuration of the analog timer 32 provided in the timer A (27). The analog timer 32 comprises transistors T41 to T49, differential amplifiers A11 to A12, resistors R10 to R11, and a capacitor CA10. Connected to the analog timer 32 are the current source Isrc which is non-temperature-dependent and the current source IsrcT whose current increases with temperature rise. When the signal bPRE indicating start of the setting operation becomes "L", the analog timer 32 charges the capacitor CA10. Then, when an input signal ACT becomes "H", the capacitor CA10 is discharged. When this capacitor CA10 is discharged, the output signal TUP becomes "H". The time measured by the analog timer 32 is from the input signal ACT becoming "H" until the output signal TUP becomes "H". When the current of the current source IsrcT increases, a period from the input signal ACT becoming "H" until the output signal TUP becoming "H" is reduced.

Figure 19:
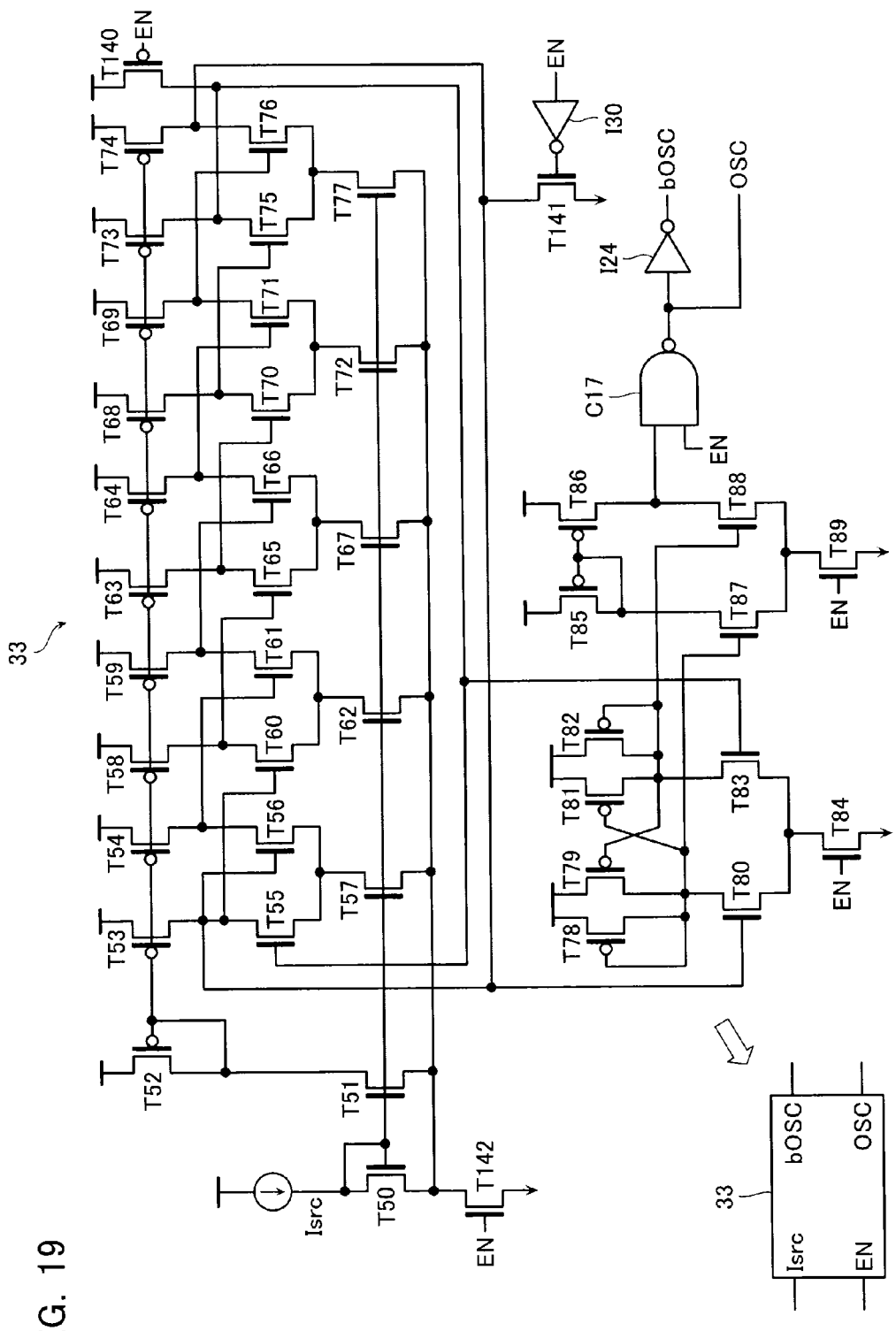
FIG. 19 is a circuit diagram of the control circuit of the semiconductor memory device according to the second embodiment.

FIG. 19 is a circuit diagram showing the configuration of the current control oscillator 33 provided in the timer A (27) and the timer B (28). The current control oscillator 33 comprises transistors T50 to T89 and T140 to T142, a logic circuit C17, and inverters I24 and I30. Connected to the current control oscillator is the current source Isrc which is non-temperature-dependent. The current control oscillator 33 outputs oscillation signals OSC and bOSC based on the current of the current source Isrc. When the current of the current source Isrc increases, frequencies of the oscillation signals OSC and bOSC increase. The transistors T140 to T142 and the inverter I30 are provided for initial setting of the current control oscillator 33.

Figure 20:
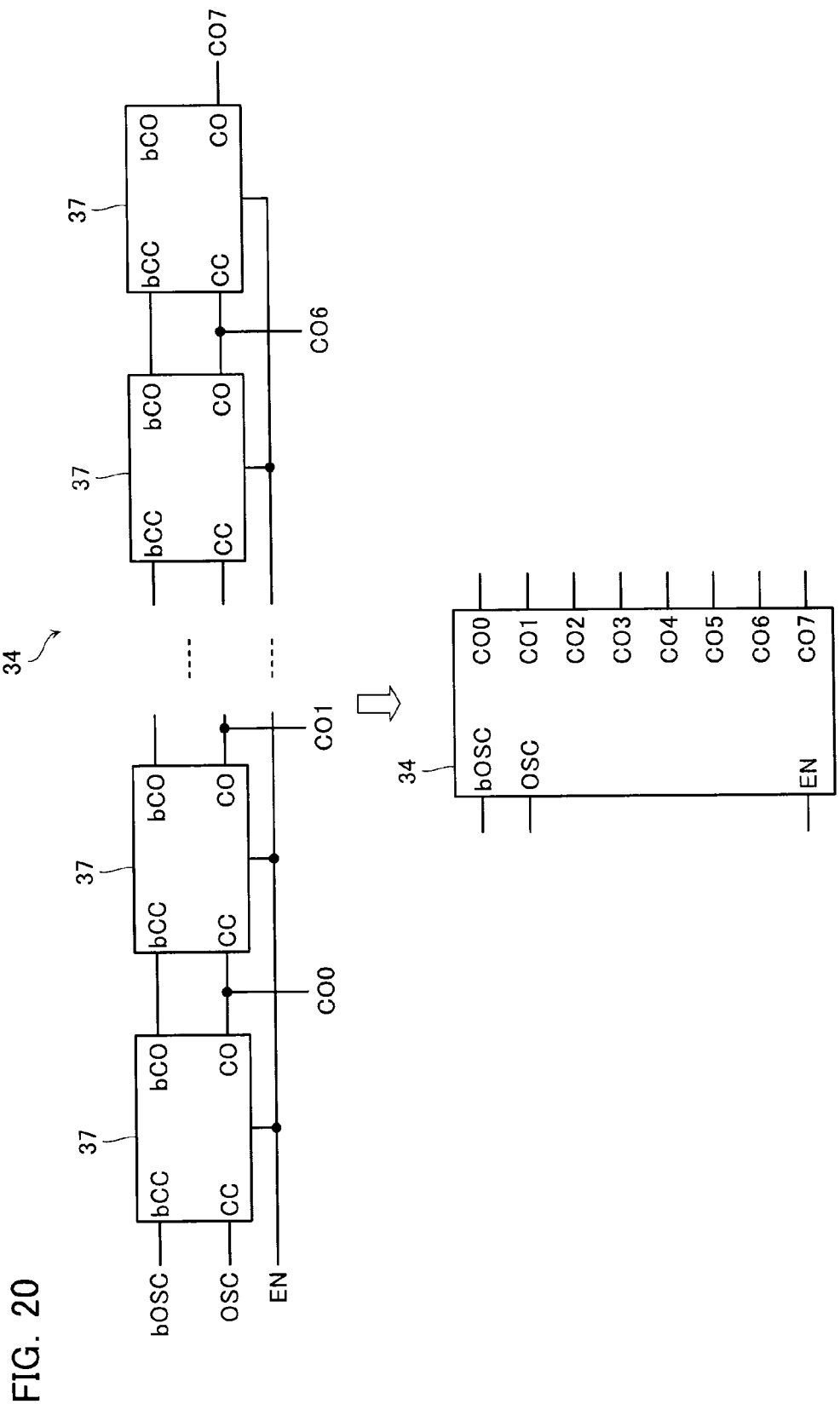
FIG. 20 is a circuit diagram of the control circuit of the semiconductor memory device according to the second embodiment.
Figure 21:
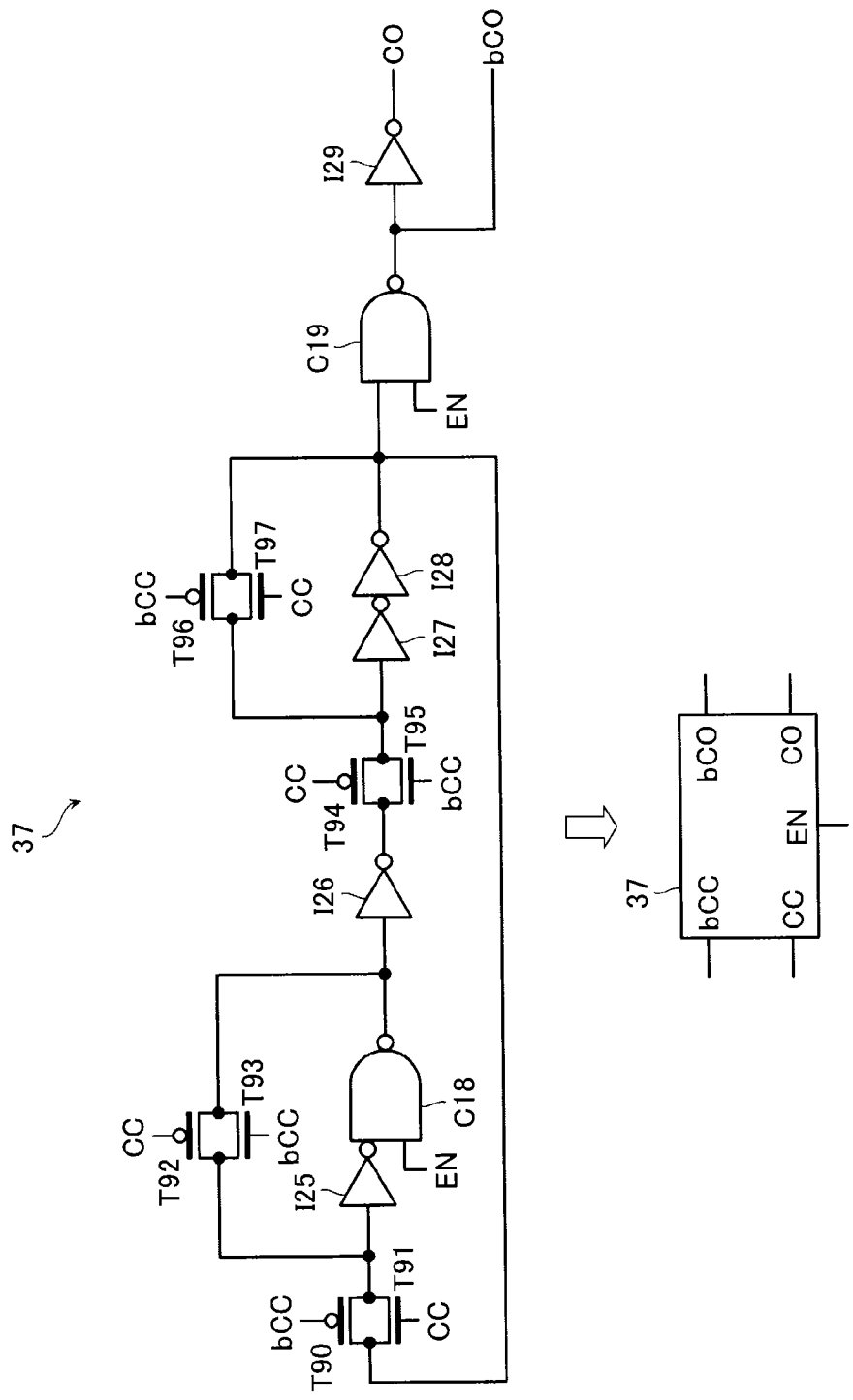
FIG. 21 is a circuit diagram of the control circuit of the semiconductor memory device according to the second embodiment.

FIG. 20 is a circuit diagram showing the configuration of the binary counter 34 provided in the timer A (27) and the timer B (28). The binary counter 34 is configured having a plurality of (for example, eight) components 37 connected therein. Every time the oscillation signal OSC inputted to the binary counter 34 once rises, the binary counter 34 outputs the signals CO0 to CO7 such that the number expressed in binary by the output signals CO0 to CO7 increases one at a time. FIG. 21 is a circuit diagram showing the component 37 of the binary counter 34. The component 37 comprises transistors T90 to T97, inverters I25 to I29, and logic circuits C18 to C19, receives signals CC and bCC from the previous-stage component 37, and transmits the signals CO and bCO to the next-stage component 37.

Figure 22:
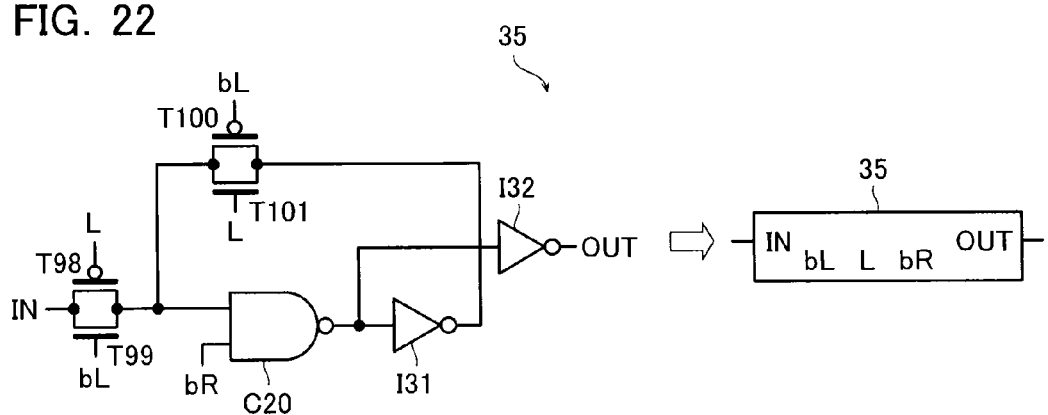
FIG. 22 is a circuit diagram of the control circuit of the semiconductor memory device according to the second embodiment.

FIG. 22 is a circuit diagram showing the configuration of the latch 35 provided in the timer A (27). The latch 35 comprises transistors T98 to T101, inverters I31 to I32, and a logic circuit C20. The latch 35 receives and stores the signals CO0 to CO7 sent from the binary counter 34, as an input signal IN, and outputs a signal OUT to the parameter table 31 based on signals L, bL, and bR.

Figure 23:
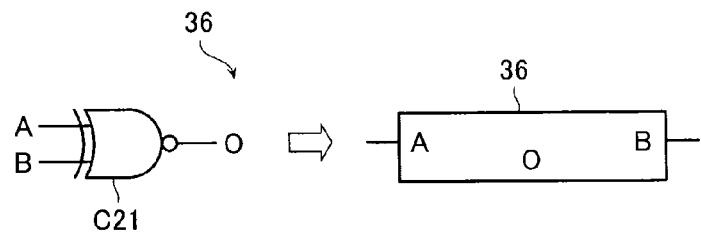
FIG. 23 is a circuit diagram of the control circuit of the semiconductor memory device according to the second embodiment.

FIG. 23 is a circuit diagram showing the configuration of the comparator 36 provided in the timer B (28). The comparator 36 is configured from a logic circuit C21, and compares signals A and B inputted thereto to output an output signal O.

Figure 24:
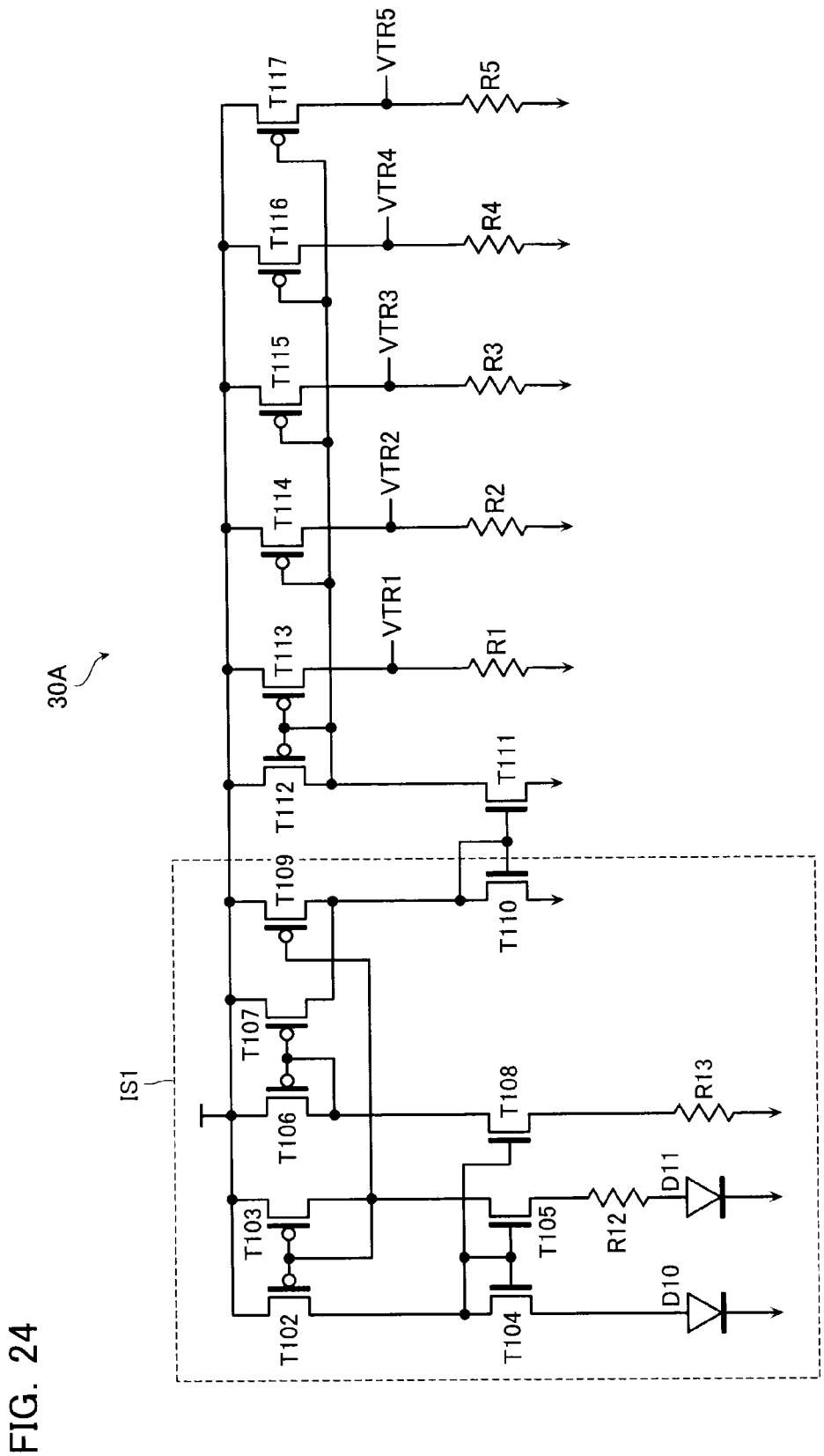
FIG. 24 is a circuit diagram of the control circuit of the semiconductor memory device according to the second embodiment.

FIG. 24 is a circuit diagram showing the configuration of part of the temperature measuring circuit 30. A temperature measuring circuit 30A comprises transistors T102 to T117, resistors R1 to R5, resistors R12 to R13, and diodes D10 to D11. The transistors T102 to T110, the resistors R12 to R13, and the diodes D10 to D11 configure a constant current source IS1. The constant current source IS1 generates a constant current that does not depend on temperature or voltage. The temperature measuring circuit 30A uses the constant current generated by the constant current source IS1 and the resistors R1 to R5 to generate reference voltages VTR1 to VTR5.

Figure 25:
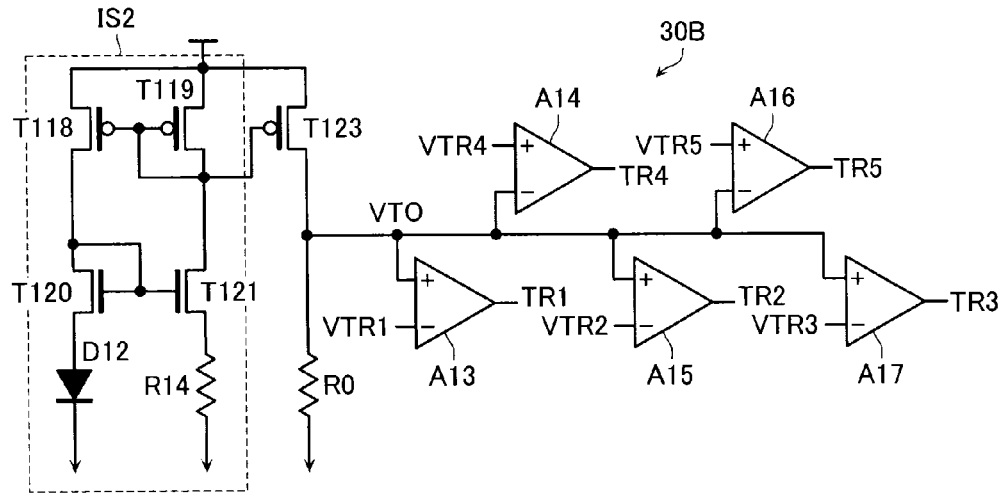
FIG. 25 is a circuit diagram of the control circuit of the semiconductor memory device according to the second embodiment.
Figure 26:
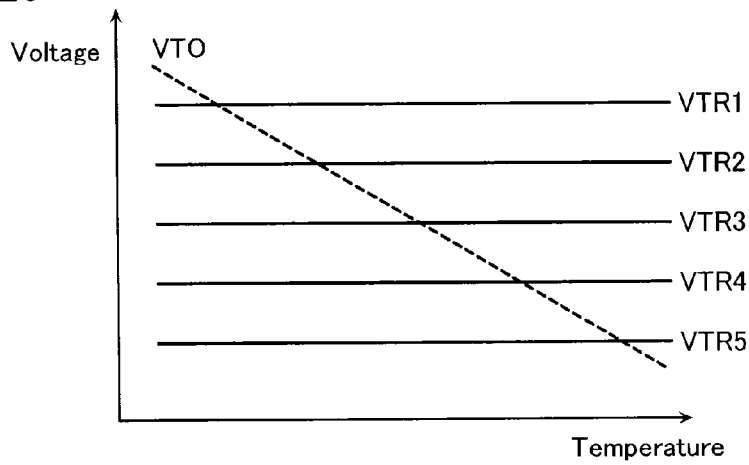
FIG. 26 is a view explaining a state of voltage of the semiconductor memory device according to the second embodiment.

FIG. 25 is a circuit diagram showing the configuration of part of the temperature measuring circuit 30. A temperature measuring circuit 30B comprises transistors T118 to T121, and T123, resistors R0 and R14, a diode D12, and differential amplifiers A13 to A17. The transistors T118 to T121, the resistor R14, and the diode D12 comprise a current source IS2. The current source IS2 generates a current that depends on temperature and voltage. A temperature-dependent voltage VT0 is generated by the current of the current source IS2 and the resistor R0. Moreover, the temperature measuring circuit 30B compares the reference voltages VTR1 to VTR5 generated by the temperature measuring circuit 30A and the voltage VT0. FIG. 26 is a graph showing a relationship between voltage and temperature in the voltage VT0 and the reference voltages VTR1 to VTR5. The temperature measuring circuit 30 can measure in what temperature range the present temperature is included based on a higher-lower relationship between the voltage VT0 and the reference voltages VTR1 to VTR5. The temperature measuring circuit 30 transmits signals TR1 to TR5 indicating a measurement result of temperature to the parameter table 31.

Figure 27:
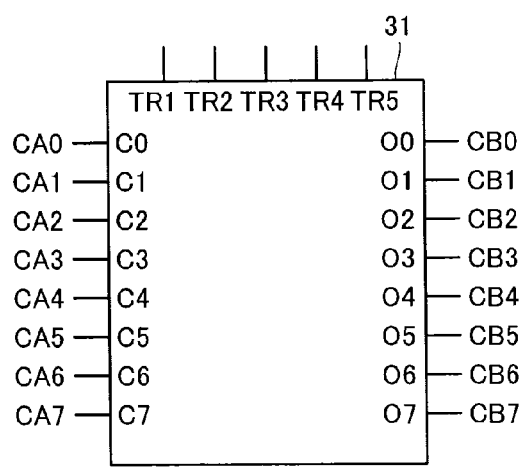
FIG. 27 is a circuit diagram of the control circuit of the semiconductor memory device according to the second embodiment.
Figure 28:
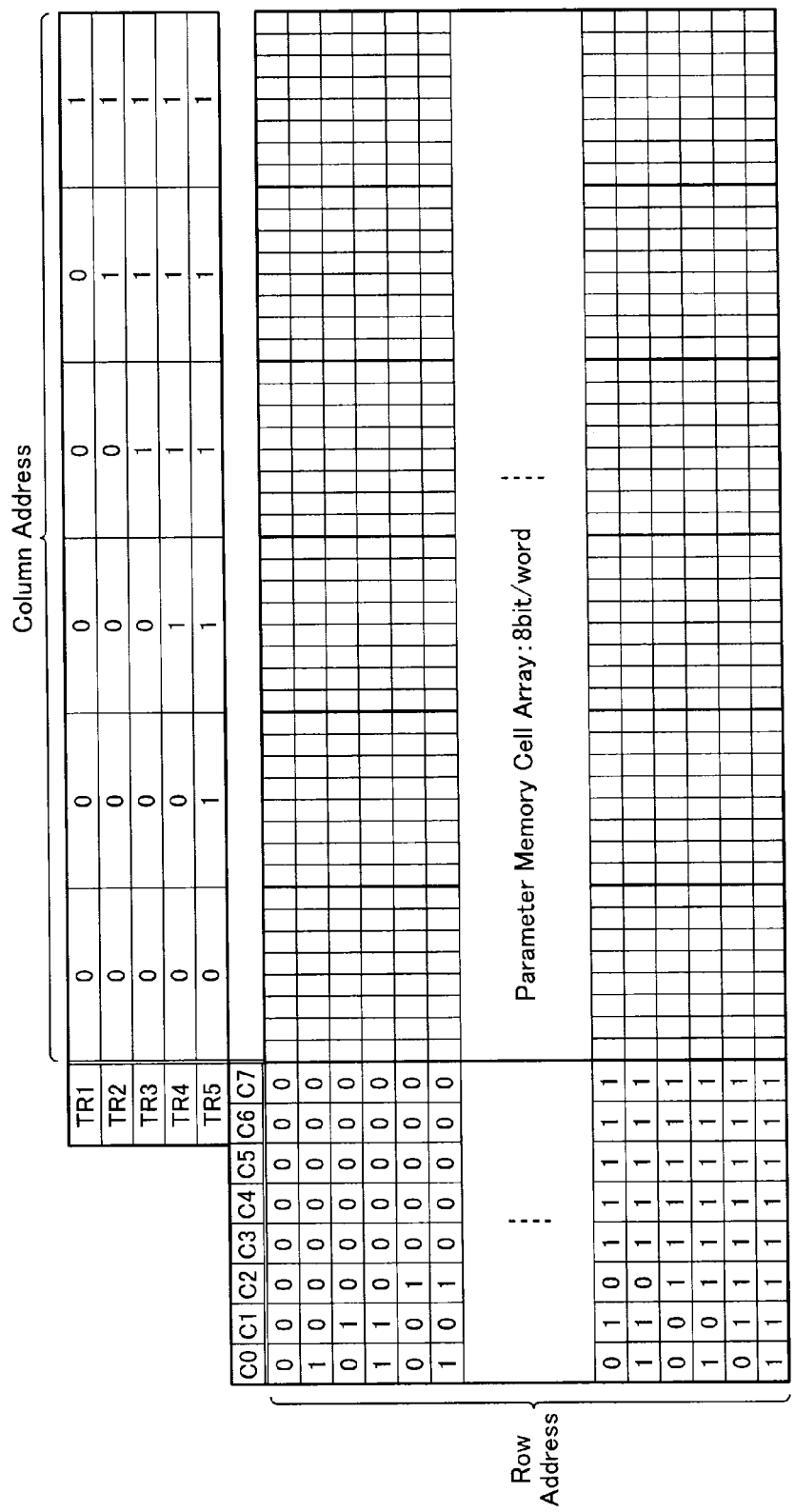
FIG. 28 is a view explaining a parameter table of the semiconductor memory device according to the second embodiment.

FIG. 27 is a circuit diagram showing the configuration of the parameter table 31. The parameter table 31 is inputted with output signals CA0 to CA7 of the timer A (27) as a row address, and is inputted with the output signals TR1 to TR5 of the temperature measuring circuit 30 as a column address. The parameter table 31 selects the additional setting operation time of the selected memory cell MC based on these row address and column address. The signal inputted as the row address represents the time when the cell current of the selected memory cell MC reaches the threshold current Ith, which is measured by the timer A (27). If reference is made to the above mathematical expression 1, the time required for the additional setting operation of the selected memory cell MC is calculated based on this row address, for each selected memory cell MC. This time required for the additional setting operation is stored beforehand as data in a parameter memory cell array of the parameter table 31 (refer to FIG. 28). The parameter table 31 selects the additional setting operation time based on the inputted row address and column address, and outputs the additional setting operation time to the timer B (28).

Figure 29:
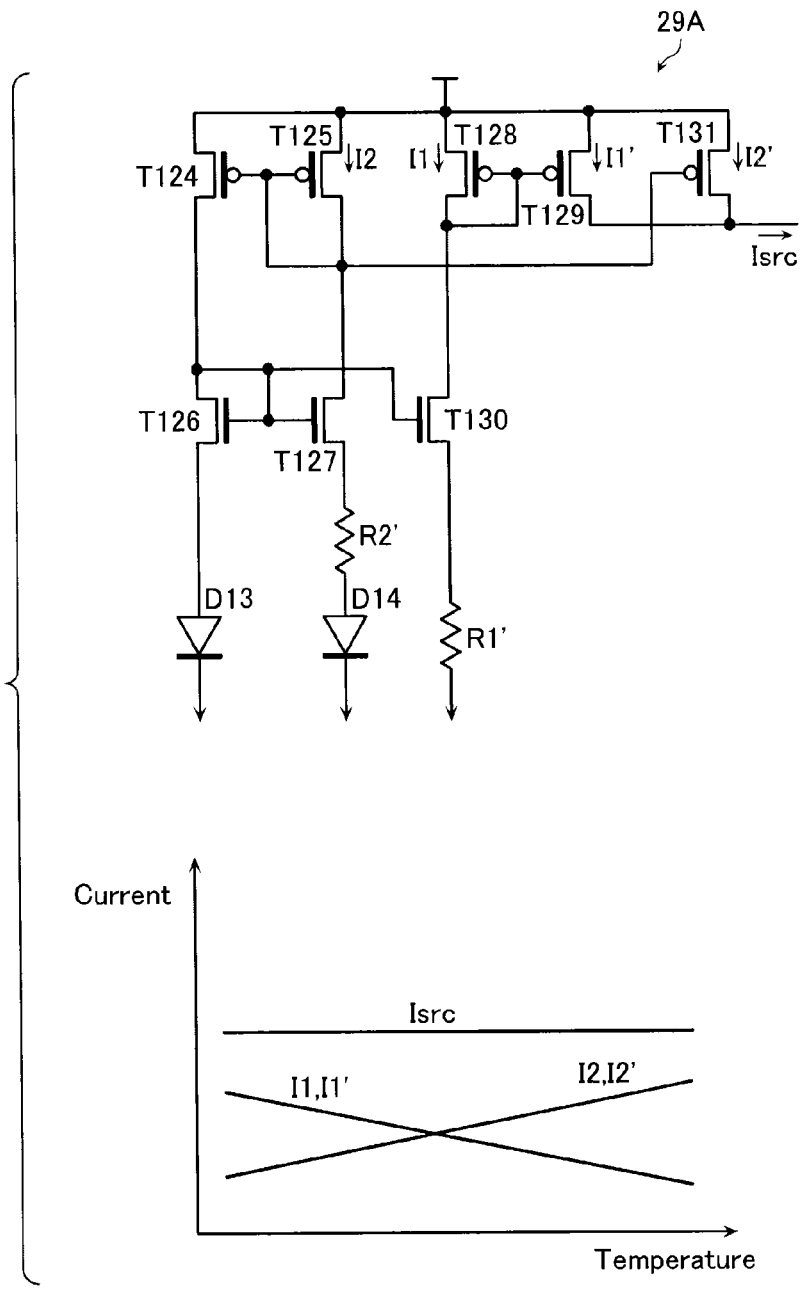
FIG. 29 is a circuit diagram of the control circuit of the semiconductor memory device according to the second embodiment.

FIG. 29 is a circuit diagram showing the configuration of part of the current source 29. A current source 29A comprises transistors T124 to T131, resistors R1' to R2', and diodes D13 to D14. Currents I1 and I1' and currents I2 and I2' flowing inside the current source 29A have temperature dependence, but the current Isrc outputted from the current source 29A is a constant current Isrc that does not depend on temperature.

Figure 30:
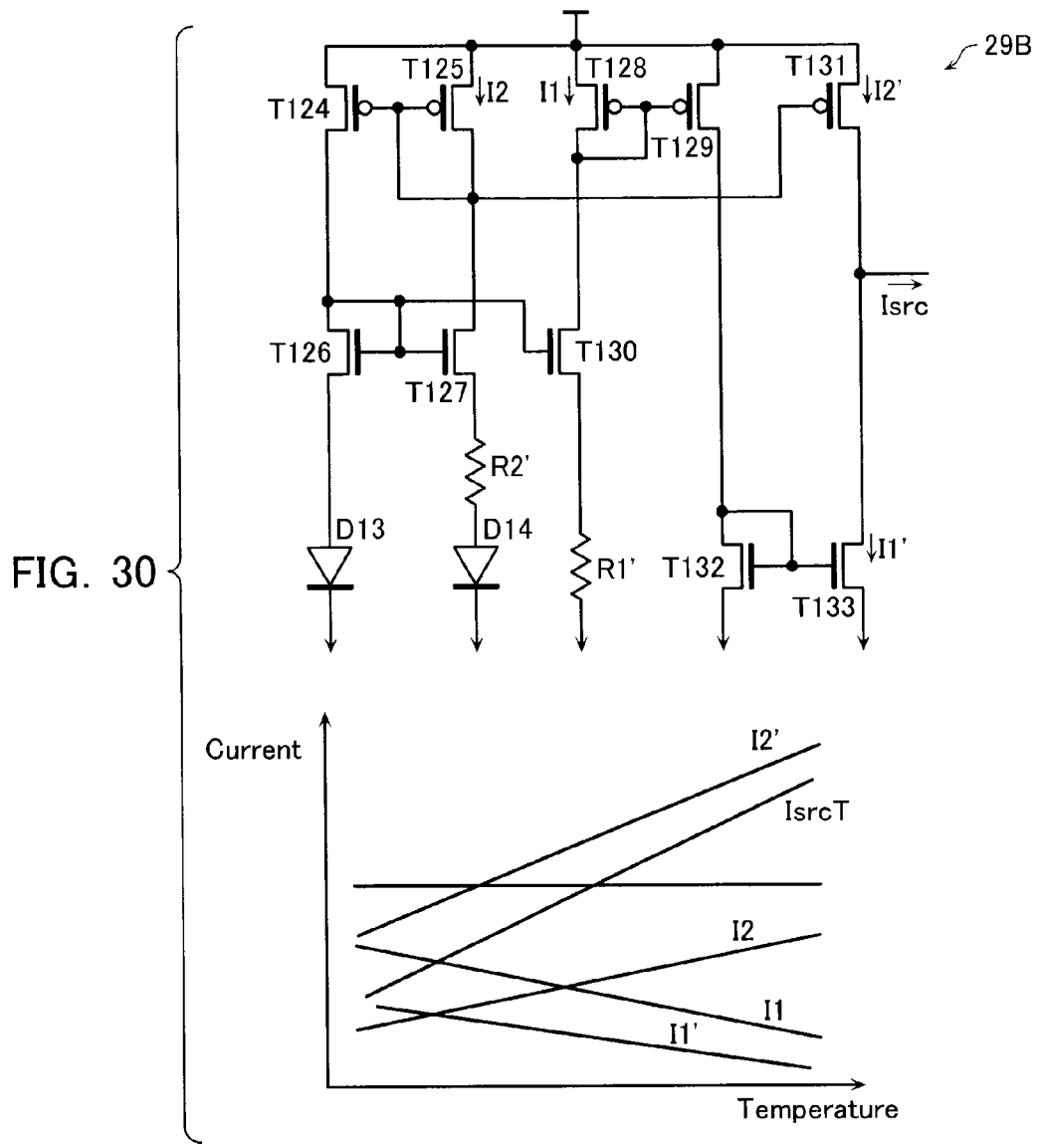
FIG. 30 is a circuit diagram of the control circuit of the semiconductor memory device according to the second embodiment.

FIG. 30 is a circuit diagram showing the configuration of part of the current source 29. A current source 29B comprises transistors T131 to T133, in addition to the configuration of the current source 29A. The currents I1 and I1' and the currents I2 and I2' flowing inside the current source 29B have temperature dependence, and the current IsrcT outputted from the current source 29B is also the current IsrcT that depends on temperature. The current IsrcT has a current value that increases as temperature rises.

Figure 31:
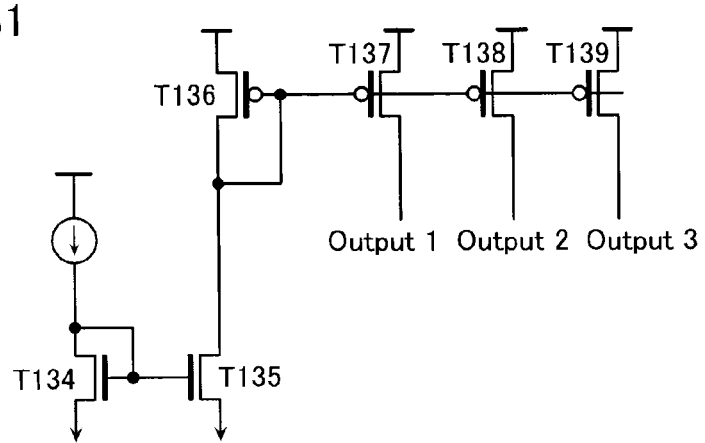
FIG. 31 is a circuit diagram of the control circuit of the semiconductor memory device according to the second embodiment.

FIG. 31 is a circuit diagram showing the configuration for supplying the current generated by the current source 29, within the control circuit. This circuit comprises transistors T134 to T139. The current source connected to the transistor T134 may supply the current Isrc or may supply the current IsrcT. The current supplied from this current source is supplied within the control circuit from output 1 to output 3.

[Operation of Control Circuit]

Next, operation of the control circuit configured in this way will be explained. FIG. 12 is an operation waveform chart of the control circuit of the present embodiment.

First, at time t1, when the signal bPRE becomes an "L" state, the setting operation is started, and the signal SET becomes an "H" state. Based on this signal SET, the setting voltage is applied to the selected memory cell MC from the current/voltage bias circuit 23 via the bit line selector 21 (time t2). Additionally at time t2, the analog timer 32 provided in the timer A (27) starts its operation. The period that this analog timer 32 is operating is the minimum period that the setting voltage is applied to the selected memory cell MC.

Next, at time t3, when the signal TUP indicating that a certain time has elapsed since start of the setting voltage application is transmitted from the analog timer to the current detection circuit 26, the current detection circuit 26 starts its operation. The cell current flowing in the selected memory cell MC and the threshold current Ith are compared by this current detection circuit 26. Additionally at time t3, time measurement by the binary counter 34 of the timer A (27) also starts.

Next, at time t4, when it is detected by the current detection circuit 26 that the cell current flowing in the selected memory cell MC has exceeded the threshold current Ith, the signal REET becomes an "H" state. Due to this signal REET, the time Tset from start of the setting operation is transmitted from the timer A (27) to the parameter table 31. Then, the parameter table 31 selects from memory within the parameter table the additional setting operation time ΔTset required for the selected memory cell MC to change completely to the set state, based on the signal from the timer A (27), and transmits the additional setting operation time ΔTset to the timer B (28).

The timer B (28) starts its operation from time t4 and continues the additional setting operation until the time of setting voltage application after time t4 reaches the additional setting operation time ΔTset.

Next, at time t5, when the time of setting voltage application after time t4 reaches the additional setting operation time ΔTset, the timer B (28) sets the signal CCD to an "H" state. Due to this signal CCD, the signal SET inverts and the setting voltage application on the selected memory cell MC finishes.

The control circuit described in the present embodiment enables the operation shown in the flowchart of FIG. 10 to be executed. Note that due to the operation waveform chart of the present embodiment shown in FIG. 12, the period from time t2 to time t4 is the setting operation time Tset and the period from time t4 to time t5 is the additional setting operation time ΔTset. These setting operation and additional setting operation are executed continuously, and an overall operation time is a time Tset'.

The control circuit described in the present embodiment can adjust the additional setting operation time of the selected memory cell MC also by temperature of the semiconductor memory device. Therefore, it is also possible to set the additional setting operation time more flexibly.

Third Embodiment

Next, a third embodiment will be described with reference to FIGS. 32 to 38. An overall configuration of the semiconductor memory device of the third embodiment is similar to that of the first and second embodiments, and a detailed description thereof will be omitted. In addition, places having a similar configuration to in the first and second embodiments are assigned with identical reference symbols, and a duplicated description thereof will be omitted. The setting operation and the additional setting operation of the present embodiment differ from those of the second embodiment in being executed simultaneously on a plurality of selected memory cells MC. Operation of the semiconductor memory device according to the present embodiment will be described be low with reference to FIGS. 32 to 38.

The setting operation in the semiconductor memory device of the present embodiment is similar to that of the second embodiment shown in the flowchart of FIG. 10 besides being executed on a plurality of selected memory cells MC, hence a description thereof will be omitted. The control circuit and operation thereof for executing the setting operation on a plurality of selected memory cells MC will be described below.

[Control Circuit]

First, a detailed configuration of each part of the control circuit for executing the operation of the present embodiment will be described with reference to FIGS. 33 to 38, and then detailed operation using the control circuit will be described with reference to FIG. 32.

Figure 33:
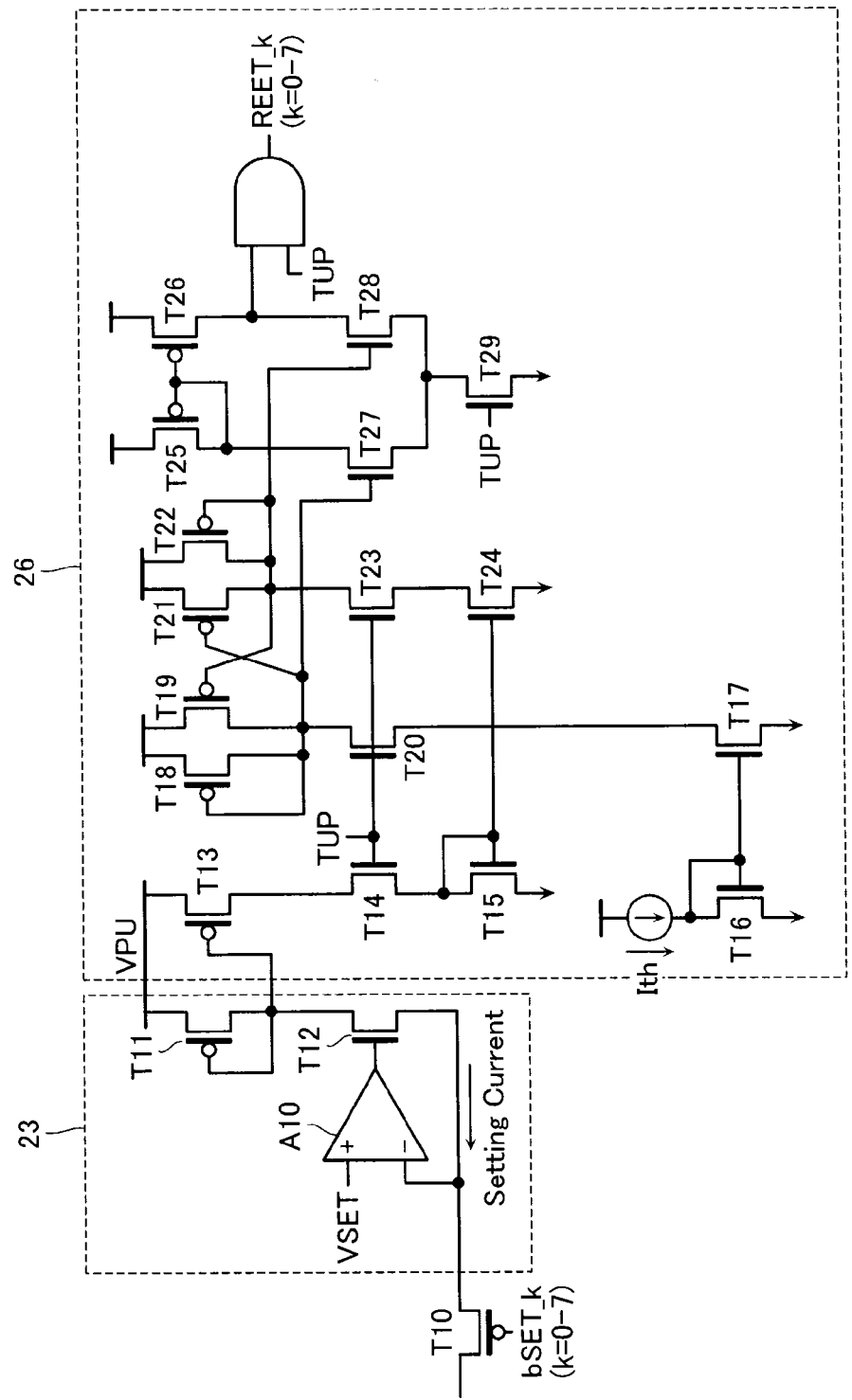
FIG. 33 is a circuit diagram of a control circuit of the semiconductor memory device according to the third embodiment.

FIG. 33 is a circuit diagram showing the configuration of the current/voltage bias circuit 23 and the current detection circuit 26. The configuration of the current/voltage bias circuit 23 is similar to that of the second embodiment. The current/voltage bias circuit 23 and the current detection circuit 26 are required to be provided in an amount of the number k of cells (for example, eight cells) on which the setting operation is to be simultaneously executed. Therefore, if the number of cells on which the setting operation is to be simultaneously executed is eight, then eight of the configurations shown in FIG. 33 are provided corresponding to the number of k.

Figure 34:
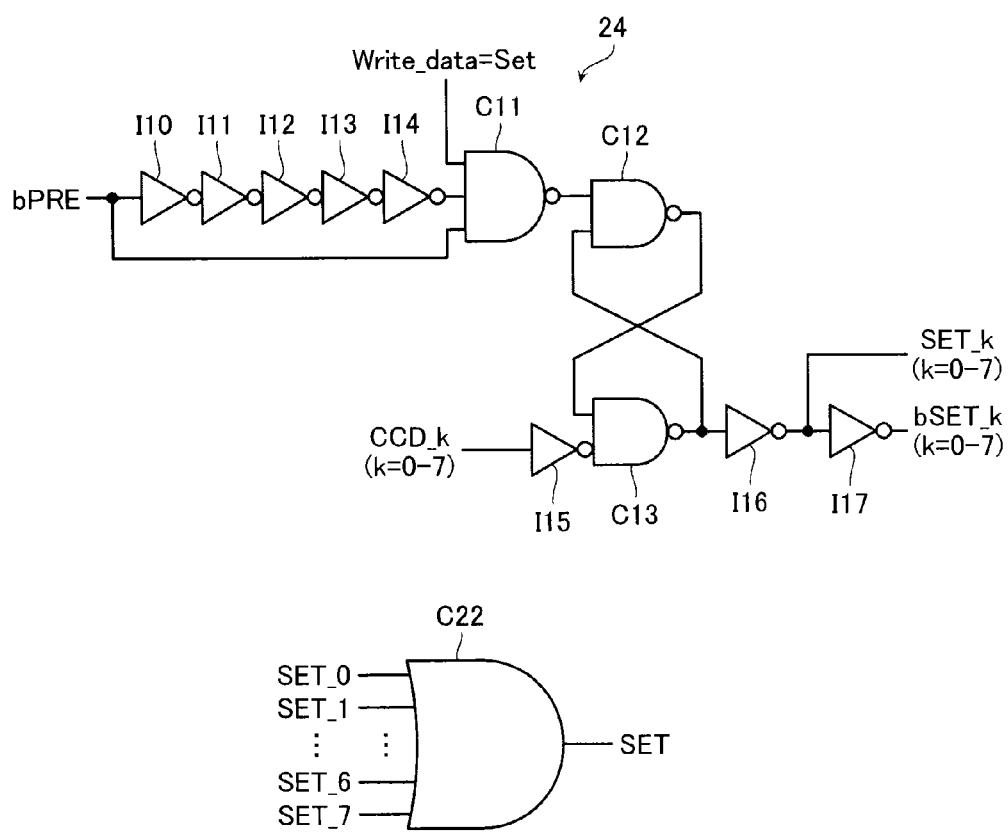
FIG. 34 is a circuit diagram of the control circuit of the semiconductor memory device according to the third embodiment.

FIG. 34 is a circuit diagram showing the configuration of the bias period setting circuit 24. The configuration of the bias period setting circuit 24 is similar to that of the second embodiment, besides comprising a logic circuit C22. This bias period setting circuit 24 is also required to be provided in an amount of the number k of cells (for example, eight cells) on which the setting operation is to be simultaneously executed. Therefore, if the number of cells on which the setting operation is to be simultaneously executed is eight, then eight of the configurations shown in FIG. 34 are provided corresponding to the number of k.

Figure 35:
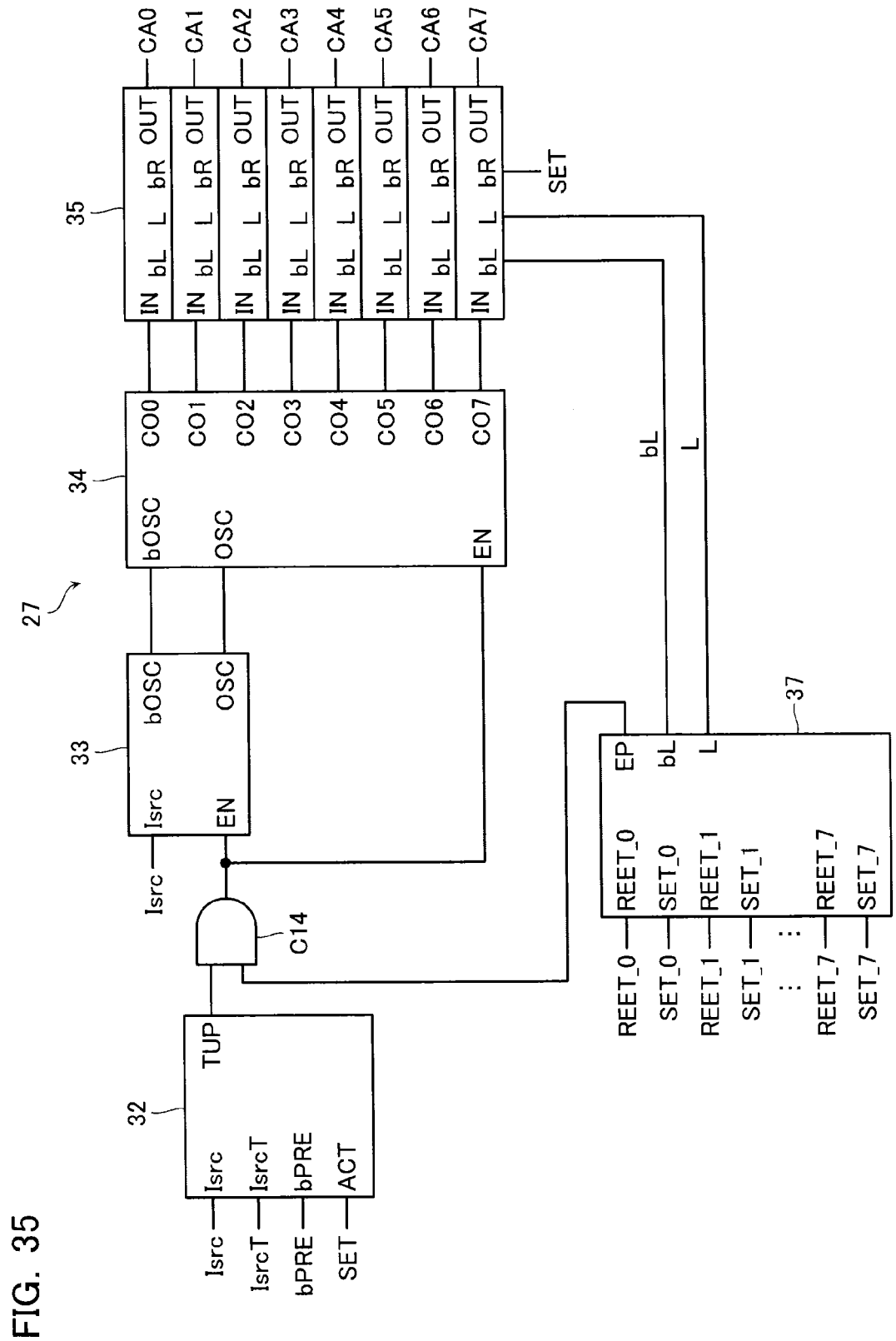
FIG. 35 is a circuit diagram of the control circuit of the semiconductor memory device according to the third embodiment.
Figure 36:
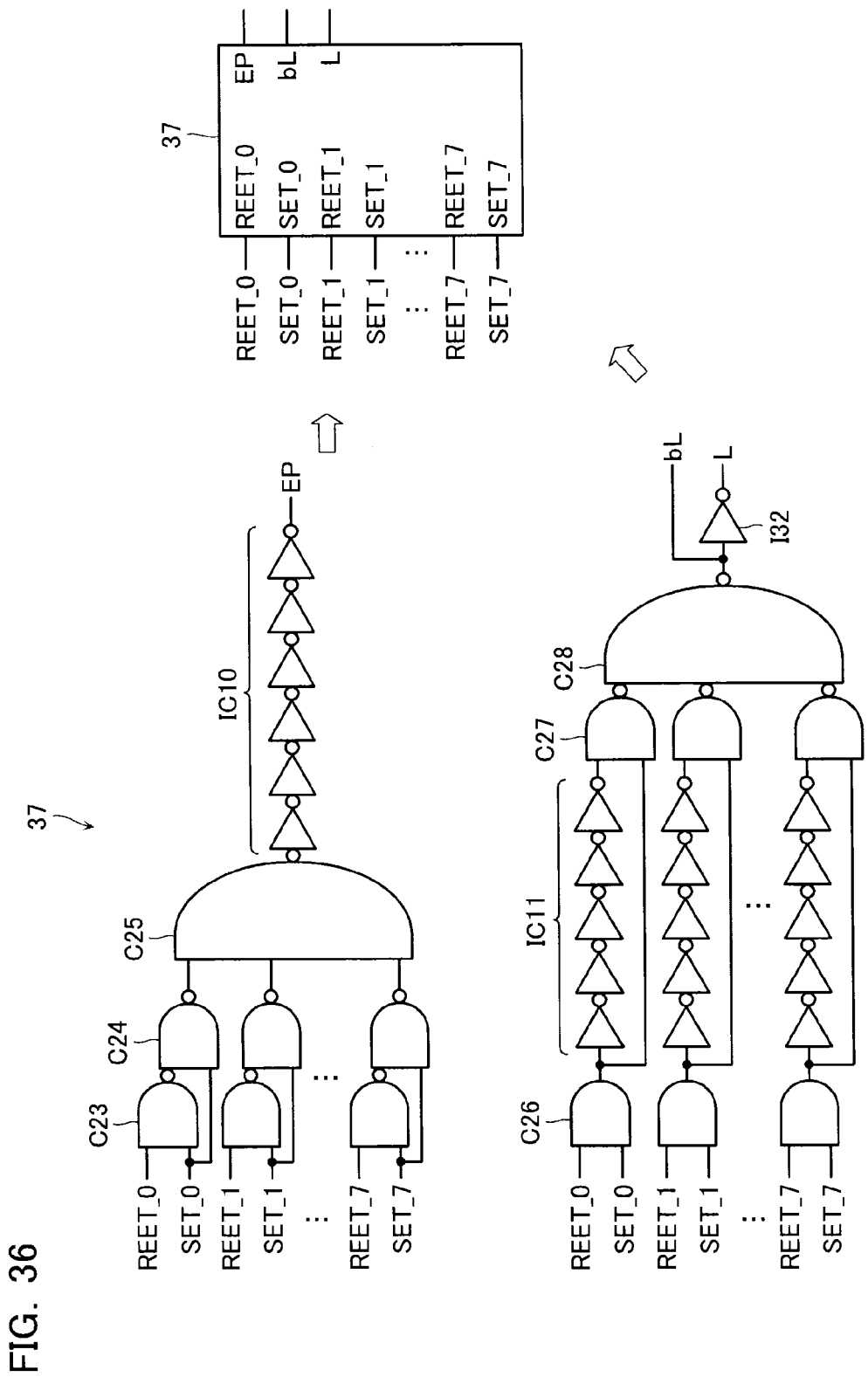
FIG. 36 is a circuit diagram of the control circuit of the semiconductor memory device according to the third embodiment.

FIG. 35 is a circuit diagram showing the configuration of the timer A (27). The timer A (27) differs from that of the second embodiment in comprising a determining circuit 37. This determining circuit 37 is a circuit for continuing operation of the timer A (27) until all of the plurality of selected memory cells MC on which the setting operation is to be simultaneously executed have shifted to the additional setting operation. FIG. 36 is a circuit diagram showing the configuration of the determining circuit 37. Signals REET_0 to REET_7 and signals SET_0 to SET_7 are outputted as a signal EP via logic circuits C23 to C25 and an inverter chain IC10. In addition, the signals REET_0 to REET_7 and the signals SET_0 to SET_7 are outputted via logic circuits C26 to C28, an inverter chain IC11, and an inverter I32, as signals L and bL. The inverter chain IC11 is provided for determining a pulse width. Moreover, the inverter chain IC10 is provided for delaying the signal, and is required to have a longer delay time than the inverter chain IC11.

Figure 37:
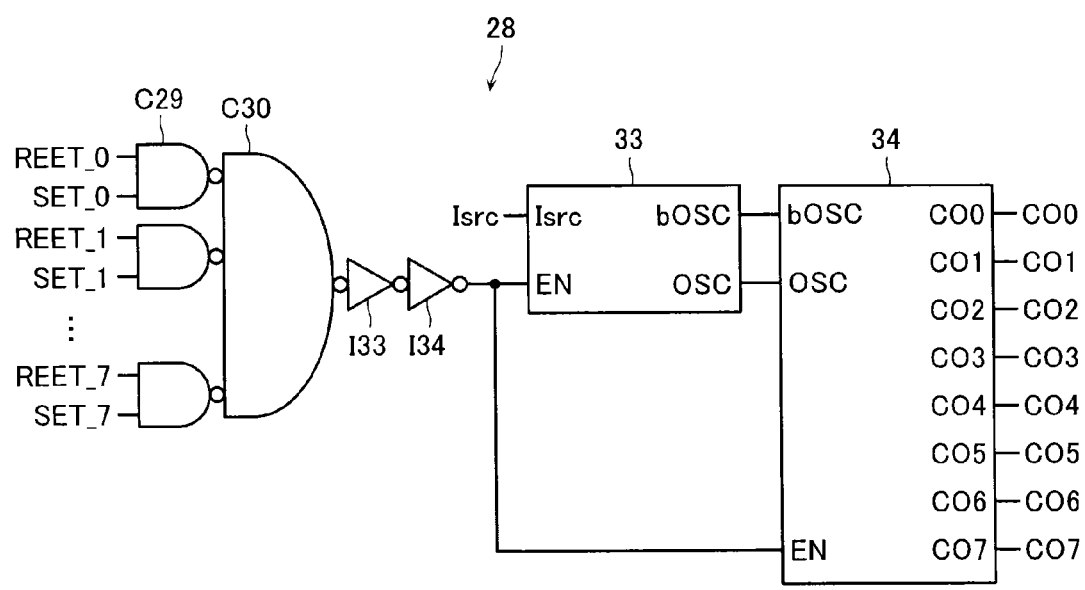
FIG. 37 is a circuit diagram of the control circuit of the semiconductor memory device according to the third embodiment.
Figure 38:
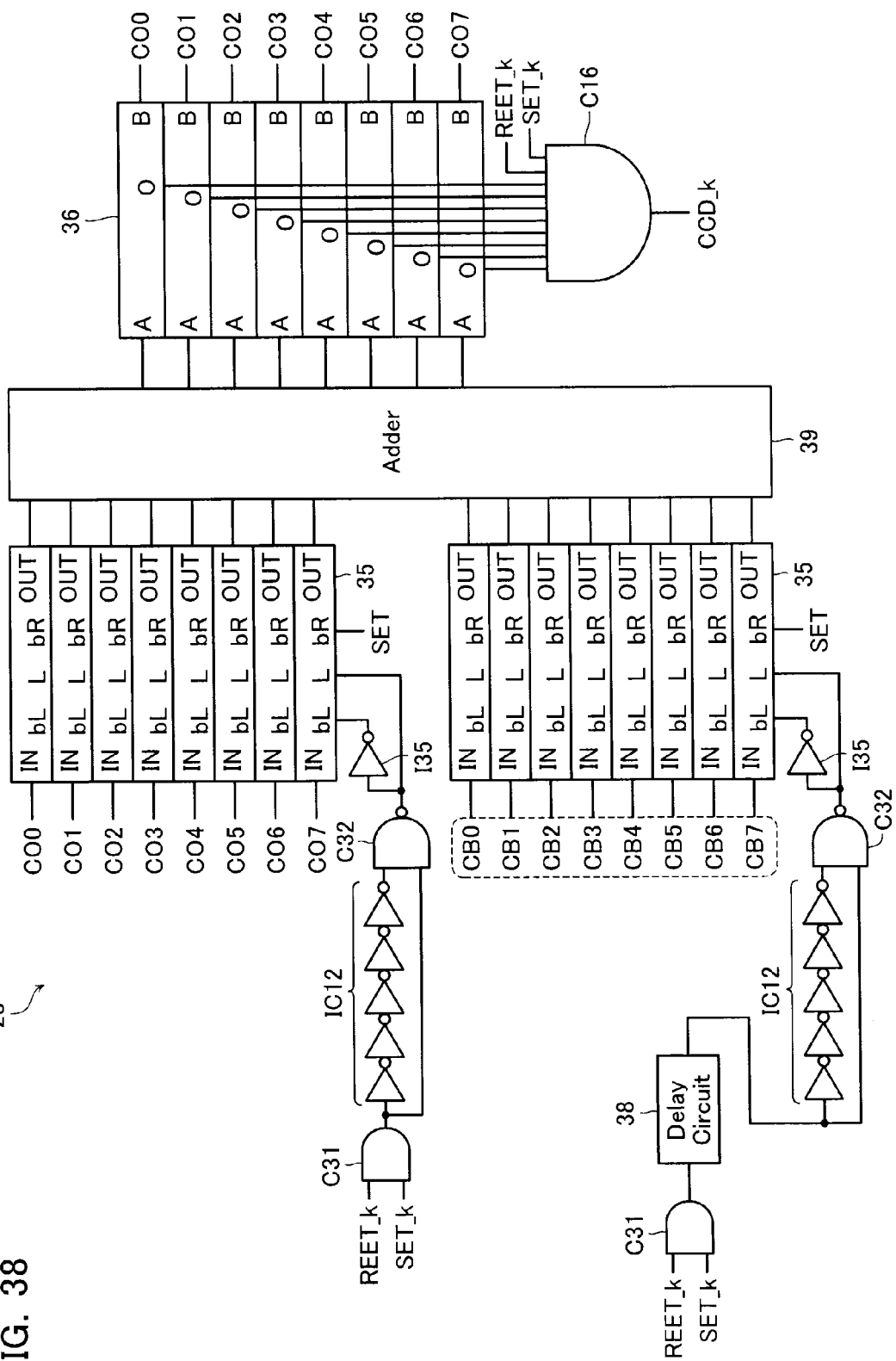
FIG. 38 is a circuit diagram of the control circuit of the semiconductor memory device according to the third embodiment.

FIGS. 37 and 38 are circuit diagrams showing the configuration of the timer B (28). As shown in FIG. 37, the timer B (28) is inputted with the signals REET_0 to REET_7 and the signals SET_0 to SET_7 via logic circuits C29 to C30 and inverters I33 to I34. The signals CO0 to CO7 are outputted to a next-stage comparator via the current control oscillator 33 and the binary counter 34.

The configuration of the timer B (28) shown in FIG. 38 is required to be provided in an amount of the number k of cells (for example, eight cells) on which the setting operation is to be simultaneously executed. Therefore, if the number of cells on which the setting operation is to be simultaneously executed is eight, then eight of the configurations shown in FIG. 38 are provided corresponding to the number of k. The timer B (28) receives the signal REET_k and the signal SET_k, and inputs these signal REET_k and signal SET_k to the latch 35 and the comparator 36 via logic circuits C31 to C32, a delay circuit 38, an inverter chain IC12, and an inverter I35. In addition, the latch 35 is also inputted with the output signals CB0 to CB7 from the parameter table 31. The timer B (28) adds an output signal of the latch 35 by an adder 39 and compares by the comparator 36.

When the cell current flowing in the selected memory cell MC reaches the threshold current Ith and the signal REET_k outputted by the current detection circuit 26 becomes "H", the timer B (28) starts its operation, and the binary counter 34 counts up until a count value of the binary counter 34 matches the output signals CB0 to CB7 from the parameter table 31. As a result, after the signal REET_k has become "H", the additional setting operation is continued until the time designated by the parameter table 31. When the time designated by the parameter table 31 is reached, the output signal CCD_k of the comparator 36 becomes "H" and the operation finishes.

The remainder of the control circuit can employ unchanged the circuits described in the second embodiment. Those circuits can be shared in the operation of each selected memory cell MC even when there are a plurality of selected memory cells MC.

[Operation of Control Circuit]

Next, operation of the control circuit configured in this way will be described. FIG. 32 is an operation waveform chart of the control circuit of the present embodiment.

First, at time t10, when the signal bPRE becomes an "L" state, the setting operation is started, and the signal SET becomes an "H" state. Based on this signal SET, the setting voltage is applied to a plurality of selected memory cells MC_k from the current/voltage bias circuit 23 via the bit line selector 21 (time t11). Additionally at time t11, the analog timer 32 provided in the timer A (27) starts its operation. The time that this analog timer 32 is operating is the minimum period that the setting voltage is applied to each selected memory cell MC_k.

Next, at time t12, when the signal TUP indicating that a certain time has elapsed since start of the setting voltage application is transmitted from the analog timer to the current detection circuit 26, the current detection circuit 26 starts its operation. The cell current flowing in each selected memory cell MC_k and the threshold current Ith are compared by this current detection circuit 26. Additionally at time t12, time measurement by the binary counter 34 of the timer A (27) also starts.

Next, at times t13, t14, and t15, when it is detected by the current detection circuit 26 that the cell current flowing in each selected memory cell MC_k has exceeded the threshold current Ith, the signal REET_k becomes an "H" state. Due to this signal REET_k, the time Tset_k from start of the setting operation is transmitted from the timer A (27) to the parameter table 31. Then, the parameter table 31 selects from memory within the parameter table the additional setting operation time ΔTset_k required for the selected memory cell MC_k to change completely to the set state, based on the signal from the timer A (27), and transmits the additional setting operation time ΔTset_k to the timer B (28).

The timer B (28) starts its operation from times t13, t14, and t15 according to a state of each selected memory cell MC_k and continues the additional setting operation until the time of setting voltage application after times t13, t14, and t15 reaches the additional setting operation time ΔTset_k.

Next, at times t16, t17, and t18, when the time of setting voltage application after time t4 reaches the additional setting operation time ΔTset_k, the timer B (28) sets the signal CCD_k to an "H" state. Due to this signal CCD_k, the signal SET_k inverts and the setting voltage application on each selected memory cell MC_k finishes.

Due to the control circuit described in the present embodiment, the operation of the second embodiment shown in the flowchart of FIG. 10 can be executed simultaneously on a plurality of selected memory cells MC. In the setting operation according to the present embodiment also, the additional setting operation time ΔTset is calculated for each selected memory cell MC, hence the additional setting operation is never executed for an unnecessarily long time period. As a result, an excessive stress can be prevented from being applied to the selected memory cell MC and deterioration of the memory cell MC can be prevented. In addition, because the operation time of the additional setting operation decreases, it becomes possible for speed of the setting operation to be improved, and energy consumption required in the operation can also be suppressed. Moreover, because the setting operation is being executed simultaneously on a plurality of selected memory cells MC, speed of operation can be further improved.

Figure 32:
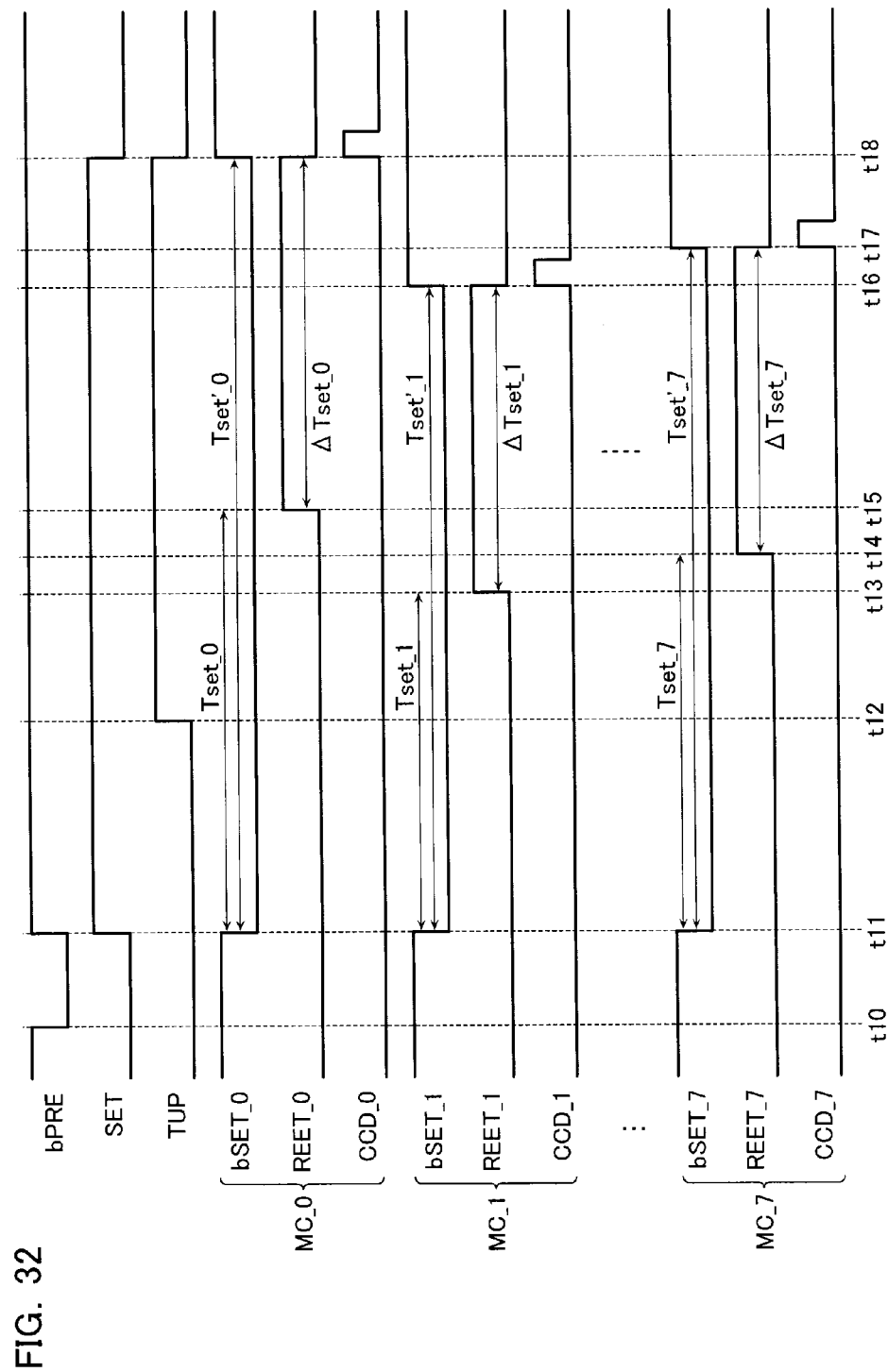
FIG. 32 is an operation waveform chart of a semiconductor memory device according to a third embodiment.

Note that due to the operation waveform chart of the present embodiment shown in FIG. 32, the setting operation time Tset_k and the additional setting operation time ΔTset_k are different times for each selected memory cell MC_k. In the present embodiment also, the setting operation and the additional setting operation are executed continuously, but a time Tset'_k which is an overall operation time is a different time for each selected memory cell MC_k.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of first lines;
a plurality of second lines extending to intersect the first lines;

a plurality of memory cells respectively disposed at intersections of the first lines and the second lines and including a variable resistance element; and a control circuit configured to control a voltage applied to the memory cells, the control circuit being configured able to, during a setting operation that changes the memory cell to a set state, execute the setting operation such that a setting voltage is applied to a selected memory cell connected to a selected first line and a selected second line, and the control circuit being configured able to change a voltage application time of the setting voltage according to a state of change of the selected memory cell during the setting operation to execute an additional setting operation that applies the setting voltage to the selected memory cell, wherein the control circuit comprises a current detection circuit configured to compare a cell current flowing in the selected memory cell during the setting operation and a threshold value current, and a timer configured to determine a time until the cell current reaches the threshold value current, and the control circuit is configured to execute the setting operation and the additional setting operation continuously and change the voltage application time of the additional setting operation based on the time until the cell current reaches the threshold value current.

2. The semiconductor memory device according to claim 1, wherein the voltage application time of the additional setting operation is longer than the voltage application time of the setting operation performed before the additional setting operation.

3. The semiconductor memory device according to claim 1, wherein the control circuit is configured able to execute the setting operation and the additional setting operation simultaneously on a plurality of selected memory cells.

4. The semiconductor memory device according to claim 1, wherein the setting operation is an operation that changes a resistance value of the variable resistance element in the selected memory cell from a high-resistance state to a low-resistance state.

5. The semiconductor memory device according to claim 1, wherein the timer further includes a first timer and a second timer, the first timer is configured to determine the time until a current flowing in the selected memory cell reaches the threshold current, and the second timer is configured to determine the voltage application time in the additional setting operation.

6. A method of performing a setting operation in a semiconductor memory device, the setting operation being an operation that changes a memory cell from a reset state to a set state, the device comprising:

a plurality of first lines;

a plurality of second lines extending to intersect the first lines; and a plurality of memory cells respectively disposed at intersections of the first lines and the second lines and including a variable resistance element, the method comprising:

applying a setting voltage to a selected memory cell connected to a selected first line and a selected second line;

comparing a cell current flowing in the selected memory cell during the setting operation and a threshold value current, and determining a time until the cell current reaches the threshold value current; and executing continuously an additional setting operation that applies the setting voltage to the selected memory cell and changing a voltage application time of the additional setting operation based on the time until the cell current reaches the threshold value current.

7. The method of performing a setting operation in a semiconductor memory device according to claim 6, wherein the voltage application time of the additional setting operation is longer than the voltage application time of the setting operation performed before the additional setting operation.

8. A semiconductor memory device, comprising:

a plurality of first lines;

a plurality of second lines extending to intersect the first lines;

a plurality of memory cells respectively disposed at intersections of the first lines and the second lines and including a variable resistance element; and a control circuit configured to control a voltage applied to the memory cells, the control circuit being configured able to, during a setting operation that changes the memory cell to a set state, execute the setting operation such that a setting voltage is applied to a selected memory cell connected to a selected first line and a selected second line, and the control circuit being configured able to change a voltage application time of the setting voltage according to a state of change of the selected memory cell during the setting operation, wherein the control circuit comprises a current detection circuit configured to compare a cell current flowing in the selected memory cell during the setting operation and a threshold value current, and a timer configured to determine a time until the cell current reaches the threshold value current, and the control circuit is configured able to change the voltage application time of the setting voltage based on the time until the cell current reaches the threshold value current.

9. The semiconductor memory device according to claim 8, wherein the setting operation is an operation that changes a resistance value of the variable resistance element in the selected memory cell from a high-resistance state to a low-resistance state.

10. The semiconductor memory device according to claim 8, wherein the control circuit is configured able to execute the setting operation simultaneously on a plurality of selected memory cells.

* * * * *